US007447056B2

(12) United States Patent
Scheuerlein et al.

(10) Patent No.: US 7,447,056 B2
(45) Date of Patent: Nov. 4, 2008

(54) METHOD FOR USING A MULTI-USE MEMORY CELL AND MEMORY ARRAY

(75) Inventors: Roy E. Scheuerlein, Cupertino, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 238 days.

(21) Appl. No.: 11/496,984

(22) Filed: Jul. 31, 2006

(65) Prior Publication Data

US 2007/0070690 A1    Mar. 29, 2007

(51) Int. Cl.
*G11C 11/00* (2006.01)
(52) U.S. Cl. ............................ 365/148; 365/46; 365/100
(58) Field of Classification Search ................ 365/148, 365/46, 100
See application file for complete search history.

(56) References Cited

U.S. PATENT DOCUMENTS

| | | | |
|---|---|---|---|
| 4,646,266 A | 2/1987 | Ovshinsky | |
| 5,541,869 A | 7/1996 | Rose | |
| 5,714,795 A * | 2/1998 | Ohmi et al. ................. | 257/530 |
| 5,751,012 A | 5/1998 | Wolstenholme | |
| 5,915,167 A | 6/1999 | Leedy | |
| 5,943,264 A | 8/1999 | Fournel et al. | |
| 6,034,882 A | 3/2000 | Johnson et al. | |
| 6,051,851 A * | 4/2000 | Ohmi et al. ................. | 257/185 |
| 6,055,180 A | 4/2000 | Gudeson | |
| 6,072,716 A | 6/2000 | Jacobson | |
| 6,130,835 A | 10/2000 | Scheuerlein | |
| 6,306,718 B1 | 10/2001 | Singh et al. | |
| 6,407,953 B1 | 6/2002 | Cleeves | |

(Continued)

FOREIGN PATENT DOCUMENTS

DE    10 2004 029939    1/2006

(Continued)

OTHER PUBLICATIONS

Kato et al., "Constant Voltage Trimming of Heavily Doped Polysilicon Resistors", *Jpn. J. Appl. Phys.*, Jan. 1995, pp. 48-53, Part 1, Vol. 34, No. 1.

(Continued)

*Primary Examiner*—Viet Q Nguyen
(74) *Attorney, Agent, or Firm*—Brinks Hofer Gilson & Lione

(57) ABSTRACT

A method for using a multi-use memory cell and memory array are disclosed. In one preferred embodiment, a memory cell is operable as a one-time programmable memory cell or a rewritable memory cell. The memory cell comprises a memory element comprising a semiconductor material configurable to one of at least three resistivity states, wherein a first resistivity state is used to represent a data state of the memory cell when the memory cell operates as a one-time programmable memory cell but not when the memory cell operates as a rewritable memory cell. A memory array with such memory cells is also disclosed. In another preferred embodiment, a memory cell is provided comprising a switchable resistance material, wherein the memory cell is operable in a first mode in which the memory cell is programmed with a forward bias and a second mode in which the memory cell is programmed with a reverse bias.

9 Claims, 19 Drawing Sheets

U.S. PATENT DOCUMENTS

| | | | |
|---|---|---|---|
| 6,420,215 | B1 | 7/2002 | Knall et al. |
| 6,473,332 | B1 | 10/2002 | Ignatiev |
| 6,478,231 | B1 * | 11/2002 | Taussig ..................... 235/492 |
| 6,483,734 | B1 | 11/2002 | Sharma et al. |
| 6,483,736 | B2 * | 11/2002 | Johnson et al. ............. 365/130 |
| 6,545,891 | B1 | 4/2003 | Tringali et al. |
| 6,552,409 | B2 * | 4/2003 | Taussig et al. ............. 257/529 |
| 6,567,299 | B2 | 5/2003 | Kunikiyo et al. |
| 6,584,541 | B2 | 6/2003 | Friedman et al. |
| 6,618,295 | B2 | 9/2003 | Scheuerlein |
| 6,646,912 | B2 | 11/2003 | Hurst et al. |
| 6,694,415 | B2 | 2/2004 | March et al. |
| 6,711,043 | B2 | 3/2004 | Friedman et al. |
| 6,731,528 | B2 * | 5/2004 | Hush et al. .................. 365/100 |
| 6,741,495 | B2 | 5/2004 | Kunikiyo et al. |
| 6,754,098 | B2 | 6/2004 | Kunikiyo |
| 6,765,813 | B2 | 7/2004 | Scheuerlein et al. |
| 6,768,661 | B2 | 7/2004 | Vyvoda et al. |
| 6,791,859 | B2 * | 9/2004 | Hush et al. .................. 365/100 |
| 6,791,885 | B2 * | 9/2004 | Casper et al. .......... 365/189.07 |
| 6,825,489 | B2 * | 11/2004 | Kozicki ....................... 257/42 |
| 6,834,008 | B2 | 12/2004 | Rinerson et al. |
| 6,836,433 | B2 | 12/2004 | Kondo |
| 6,839,262 | B2 | 1/2005 | Vyvoda et al. |
| 6,839,263 | B2 * | 1/2005 | Fricke et al. .................. 365/63 |
| 6,856,570 | B2 * | 2/2005 | Fischer ....................... 365/226 |
| 6,858,883 | B2 * | 2/2005 | Fricke et al. ................ 257/104 |
| 6,868,022 | B2 | 3/2005 | Scheuerlein |
| 6,879,508 | B2 * | 4/2005 | Tran ........................... 365/100 |
| 6,881,623 | B2 | 4/2005 | Campbell |
| 6,885,604 | B1 * | 4/2005 | Ott ........................... 365/225.7 |
| 6,903,361 | B2 * | 6/2005 | Gilton ........................... 257/2 |
| 6,917,532 | B2 * | 7/2005 | Van Brocklin et al. ........ 365/51 |
| 6,930,909 | B2 * | 8/2005 | Moore et al. ................ 365/148 |
| 6,947,318 | B1 * | 9/2005 | Fujita ......................... 365/173 |
| 6,950,369 | B2 | 9/2005 | Kunikiyo et al. |
| 6,952,030 | B2 | 10/2005 | Herner et al. |
| 6,954,385 | B2 * | 10/2005 | Casper et al. .......... 365/189.07 |
| 6,961,262 | B2 | 11/2005 | Perner |
| 6,996,660 | B1 | 2/2006 | Moore et al. |
| 7,000,063 | B2 | 2/2006 | Friedman et al. |
| 7,003,619 | B1 | 2/2006 | Moore et al. |
| 7,031,182 | B2 | 4/2006 | Beigel et al. |
| 7,046,569 | B2 * | 5/2006 | Ito et al. ..................... 365/225 |
| 7,062,602 | B1 | 6/2006 | Moore et al. |
| 7,071,008 | B2 | 7/2006 | Rinerson et al. |
| 7,116,573 | B2 * | 10/2006 | Sakamoto et al. ........... 365/153 |
| 7,132,350 | B2 | 11/2006 | Yeh et al. |
| 7,161,218 | B2 * | 1/2007 | Bertin et al. ................. 257/415 |
| 7,190,611 | B2 | 3/2007 | Nguyen et al. |
| 7,205,564 | B2 | 4/2007 | Kajiyama |
| 7,218,550 | B2 | 5/2007 | Schwabe et al. |
| 7,224,632 | B2 * | 5/2007 | Moore et al. ................ 365/222 |
| 2003/0001230 | A1 | 1/2003 | Lowrey |
| 2003/0047765 | A1 | 3/2003 | Campbell |
| 2003/0115518 | A1 | 6/2003 | Kleveland |
| 2004/0228159 | A1 | 11/2004 | Kostylev, et al. |
| 2005/0027928 | A1 | 2/2005 | Avraham |
| 2005/0052915 | A1 | 3/2005 | Herner et al. |
| 2005/0098800 | A1 | 5/2005 | Herner et al. |
| 2005/0121743 | A1 | 6/2005 | Herner et al. |
| 2005/0123837 | A1 | 6/2005 | Chen |
| 2005/0158950 | A1 | 7/2005 | Scheuerlein et al. |
| 2005/0221200 | A1 | 10/2005 | Chen |
| 2005/0226067 | A1 | 10/2005 | Herner et al. |
| 2006/0003586 | A1 | 1/2006 | Raghuram et al. |
| 2006/0047920 | A1 | 3/2006 | Moore et al. |
| 2007/0069276 | A1 | 3/2007 | Scheuerlein et al. |
| 2007/0070690 | A1 | 3/2007 | Scheuerlein et al. |
| 2007/0101131 | A1 | 5/2007 | Davtchev et al. |
| 2007/0164309 | A1 | 7/2007 | Kumar et al. |
| 2008/0017912 | A1 | 1/2008 | Kumar et al. |
| 2008/0023790 | A1 | 1/2008 | Scheuerlein et al. |

FOREIGN PATENT DOCUMENTS

| | | |
|---|---|---|
| EP | 0 788 113 | 8/1997 |
| EP | 1450373 | 8/2004 |
| WO | 2004055827 | 7/2004 |
| WO | WO 2005/066969 A1 | 7/2005 |
| WO | WO 2006/121837 A2 | 11/2006 |
| WO | WO 2007/126669 A1 | 11/2007 |

OTHER PUBLICATIONS

PCT Search Report dated Jan. 22, 2008 for Appl. No. PCT/US2007/013770, 12 pages.

Office Action dated Jan. 30, 2008 for U.S. Appl. No. 11/497,021, 14 pages.

U.S. Appl. No. 09/877,691; "Method For Re-Directing Data Traffic In A Write-Once Memory Device;" inventors: J. James Tringali, Christopher S. Moore, Roger W. March. James E. Schneider, Derek J. Bosch, And Daniel C. Steere; filed Jun. 8, 2001.

U.S. Appl. No. 11/237,167; "Memory Cell Comprising Switchable Semiconductor Memory Element with Trimmable Resistance;" inventors: Kumar et al.; filed Sep. 28, 2005.

U.S. Appl. No. 11/395,995; "Nonvolatile Memory Cell Comprising a Diode and a Resistance-Switching Material;" inventors: Herner et al.; filed Mar. 31, 2006.

U.S. Appl. No. 11/148,530; "Nonvolatile Memory Cell Operating by Increasing Order in Polycrystalline Semiconductor Material;" inventors: Herner et al.; filed Jun. 8, 2006.

U.S. Appl. No. 10/320,470; "An Improved Method for Making High Density Nonvolatile Memory;" inventors: Herner et al.; filed Dec. 19, 2002.

U.S. Appl. No. 11/444,936; "Conductive Hard Mask to Protect Patterned Features During Trench Etch;" inventors: Radigan et al.; filed May 31, 2006.

U.S. Appl. No. 11/040,356; "A Write-Once Nonvolatile Phase Change Memory Array;" inventor: Scheuerein; filed Jan. 29, 2005.

"Multi-Level Cell NAND Flash—The Consumer Choice," Toshiba America Electronic Corporation, http://www.edn.com/index.asp?layout=articlePrint&articleID-CA503389, Feb. 17, 2005, 5 pages.

"Announcing x4 Technology Breakthrough, msystems Takes the NAND Industry to the Next Level," msystems, http://www.webwire.com/ViewPressRel_print.asp?ald-14031, May 11, 2006, 3 pages.

International Search Report and Written Opinion for PCT Patent Application Serial No. PCT/US2007/013769, dated Mar. 26, 2008, 14 pages.

International Search Report and Written Opinion for PCT Patent Application Serial No. PCT/US2007/013772, dated Mar. 19, 2008, 11 pages.

Office Action for U.S. Appl. No. 11/496,870, dated Apr. 15, 2008, 12 pages.

Office Action for U.S. Appl. No. 11/496,874, dated Mar. 5, 2008, 11 pages.

Office Action for U.S. Appl. No. 11/496,983, dated Jun. 26, 2008, 7 pages.

U.S. Appl. No. 11/440,899, filed May 24, 2006, titled, "Memory Cell Comprising Nickel-Cobalt Oxide Switching Element," by Herner.

Alavi et al., A PROM Element Based on Salicide Agglomeration of Poly Fuses in a CMOS Logic Process, IEDM 1997.

Amemiya et al., Electrical Trimming of Heavily Doped Polycrystalline Silicon Resistors, IEEE Transactions Electron Devices, vol. ED-26, No. 11, Nov. 1979.

Babcock, J A., Polysilicon Resistor Trimming for Packaged Integrated Circuits, IEDM 93, 1993.

Babcock, J A., Precision Electrical Trimming of Very Low TCR Poly-SiGe Resistors, IEEE Electron Device Letters, vol. 21, No. 6, Jun. 2000.

Das, Soumen et al., A Large-Bias Conduction Model of Polycrystalline Silicon Films, IEEE Transactions on Electron Devices, vol. 41, No. 4, 524-532, Apr. 1994.

Das, Soumen, et al., Electrical Trimming of Ion-Beam-Sputtered Polysilicon Resistors by High Current Pulses, IEEE Transaction on Electron Devices, vol. 41, No. 8, 1429-1434, Aug. 1994.

Feldbaumer, D W, Pulse Current Trimming of Polysilicon Resistors, IEEE Transactions on Electron Devices, vol. 42, No. 4, 689-696, Apr. 1995.

Feldbaumer, D W. et al., Theory and Application of Polysilicon Resistor Trimming, Solid-State Electronics, vol. 38, No. 11, 1861-1869, Jan. 1995.

Kato, Kotaro et al., A Monolithic 14 Bit D/A Converter Fabricated with a New Trimming Technique (DOT), IEEE Journal of Solid-State Circuits, vol. SC-19, No. 5, 802-804-806, Oct. 1984.

Kato, Kotaro et al., A Physical Mechanism of Current-Induced Resistance Decrease in Heavily Doped Polysilicon Resistors, IEEE Transaction on Electron Devices, Vo. ED-29, No. 8, 1156-1160, Aug. 1982.

Kato, Kotaro et al., Change in Temperature Coefficient of Resistance of Heavily Doped Polysilicon Resistors Caused by Electrical Trimming, Jpn. J. Appl. Phys. vol. 35, Part 1, No. 8, 4209-4215, Aug. 1996.

Lane, William A., The Design of Thin-Film Polysilicon Resistors for Analog IC Applications, IEEE Transactions on Electron Devices, vol. 36, No. 4, 738-744, Apr. 1989.

Tobita, Toshio, New Trimming Technology of a Thick Film Resistor by the Pulse Voltage Method, IEEE Transactions on Components, Hybrids and Manufacturing Technology, vol. 14, No. 3, 613-617, Sep. 1991.

Babcock, et al., "Precision Electrical Trimming of Very Low TCR Poly-Sige Resisitors," IEEE Service Center, New York, NY, vol. 21, No. 6, Jun. 2000, pp. 283-285, XP000951962 ISSN: 0741-3106, abstract Figs. 2, 4.

Office Action for U.S. Appl. No. 11/497,021, dated May 27, 2008, 14 pages.

Office Action for U.S. Appl. No. 11/496,985, dated Jul. 18, 2008, 8 pages.

Office Action U.S. Appl. No. 11/496,985, dated Mar. 3, 2008, 8 pages.

Herner, S.B. et al., "Vertical p-i-n Polysilicon Diode with Antifuse for Stackable Field-Programmable ROM", *IEEE Electronic Device Letters*, vol. 25, No. 5, pp. 271-273, May 2004.

Li, F. et al., "Evaluation of $SiO_2$ Antifuse in a 3D-OTP Memory", *IEEE Transactions on Device and Materials Realiability*, vol. 4, No. 3, pp. 416-421, Sep. 2004.

Office Action for U.S. Appl. No. 11/496,874, dated Aug. 20, 2008, 13 pages.

\* cited by examiner

METHOD FOR USING A MULTI-USE MEMORY CELL AND MEMORY ARRAY

RELATED APPLICATIONS

This application is related to Kumar et al., U.S. application Ser. No. 11/237,167, "Memory Cell Comprising Switchable Semiconductor Memory Element with Trimmable Resistance," filed Sep. 28, 2005 and hereinafter the '167 application, which is assigned to the assignee of the present invention and hereby incorporated by reference in its entirety.

This application is related to Kumar et al., U.S. application Ser. No. 11/496,986, "Method for Using a Memory Cell Comprising Switchable Semiconductor Memory Element with Trimmable Resistance,"; to Fasoli et al., U.S. application Ser. No. 11/461,339, "Passive Element Memory Array Incorporating Reversible Polarity Word Line and Bit Line Decoders,"; to Fasoli et al., U.S. application Ser. No. 11/461,364, "Method for Using a Passive Element Memory Array Incorporating Reversible Polarity Word Line and Bit Line Decoders,"; to Scheuerlein et al., U.S. application Ser. No. 11/461,343, "Apparatus for Reading a Multi-Level Passive Element Memory Cell Array,"; to Scheuerlein et al., U.S. application Ser. No. 11/461,367, "Method for Reading a Multi-Level Passive Element Memory Cell Array,"; to Scheuerlein et al., U.S. application Ser. No. 11/461,352, "Dual Data-Dependent Busses for Coupling Read/Write Circuits to a Memory Array"; to Scheuerlein et al., U.S. application Ser. No. 11/461,369, "Method for Using Dual Data-Dependent Busses for Coupling Read/Write Circuits to a Memory Array,"; to Scheuerlein et al., U.S. application Ser. No. 11/461,359, "Memory Array Incorporating Two Data Busses for Memory Array Block Selection,"; to Scheuerlein et al., U.S. application Ser. No. 11/461,372, "Method for Using Two Data Busses for Memory Array Block Selection,"; to Scheuerlein et al., U.S. application Ser. No. 11/461,362, "Hierarchical Bit Line Bias Bus for Block Selectable Memory Array,"; to Scheuerlein et al., U.S. application Ser. No. 11/461,376, "Method for Using a Hierarchical Bit Line Bias Bus for Block Selectable Memory Array,"; to Scheuerlein et al., U.S. application Ser. No. 11/496,985, "Multi-Use Memory Cell and Memory Array,"; to Scheuerlein, U.S. application Ser. No. 11/496,874, "Mixed-Use Memory Array,"; to Scheuerlein, U.S. application Ser. No. 11/496,983, "Method for Using a Mixed-Use Memory Array,"; to Scheuerlein et al., U.S. application Ser. No. 11/496,870, "Mixed-Use Memory Array with Different Data States,"; to Scheuerlein et al., US application Ser. No. 11/497,021, "Method for Using a Mixed-Use Memory Array with Different Data States,"; to Scheuerlein, U.S. application Ser. No. 11/461,393, "Controlled Pulse Operations in Non-Volatile Memory,"; to Scheuerlein, U.S. application Ser. No. 11/461,399, "Systems For Controlled Pulse Operations In Non-Volatile Memory,"; to Scheuerlein et al., U.S. application Ser. No. 11/461,410, "High Bandwidth One Time Field-Programmable Memory,"; to Scheuerlein et al., U.S. application Ser. No. 11/461,419, "Systems for High Bandwidth One Time Field-Programmable Memory,"; to Scheuerlein et al., U.S. application Ser. No. 11/461,424, "Reverse Bias Trim Operations In Non-Volatile Memory,"; and to Scheuerlein et al., U.S. application Ser. No. 11/461,431, "Systems For Reverse Bias Trim Operations In Non-Volatile Memory,", all filed on even day herewith, all owned by the assignee of the present invention, and all hereby incorporated by reference.

BACKGROUND OF THE INVENTION

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

A substantial advantage would be provided by a nonvolatile memory array having erasable or multi-state memory cells formed using conventional semiconductor materials in structures that are readily scaled to small size.

SUMMARY OF THE PREFERRED EMBODIMENTS

The present invention is defined by the following claims, and nothing in this section should be taken as a limitation on those claims.

By way of introduction, the preferred embodiments described below provide a method for using a multi-use memory cell and memory array. In one preferred embodiment, a memory cell is operable as a one-time programmable memory cell or a rewritable memory cell. The memory cell comprises a memory element comprising a semiconductor material configurable to one of at least three resistivity states, wherein a first resistivity state is used to represent a data state of the memory cell when the memory cell operates as a one-time programmable memory cell but not when the memory cell operates as a rewritable memory cell. A memory array with such memory cells is also disclosed. In another preferred embodiment, a memory cell is provided comprising a switchable resistance material, wherein the memory cell is operable in a first mode in which the memory cell is programmed with a forward bias and a second mode in which the memory cell is programmed with a reverse bias. Other embodiments are disclosed, and each of the embodiments can be used alone or together in combination.

The preferred embodiments will now be described with reference to the attached drawings.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
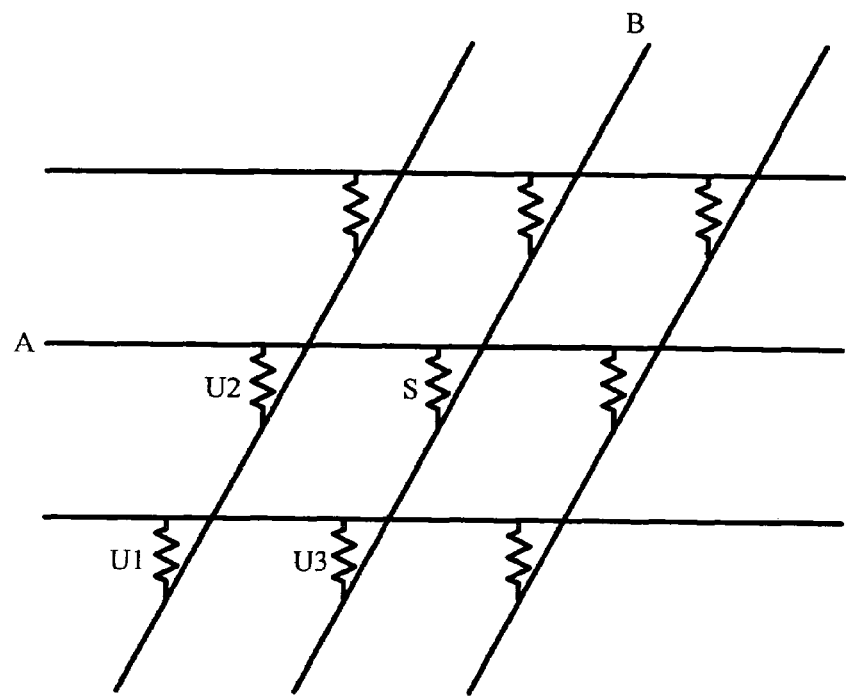
FIG. 1 is a circuit diagram illustrating the need for electrical isolation between memory cells in a memory array.

It is not conventional to use a trimmable polysilicon resistor to store a data state in a nonvolatile memory cell, however. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell as a two-terminal device including a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a monolithic three dimensional memory array in which the data state of a memory cell is stored in the resistivity state of the polycrystalline semiconductor material of a semiconductor junction diode. This memory cell is a one-time-programmable cell having two data states. The diode is formed in a high-resistivity state; application of a programming voltage permanently transforms the diode to a low-resistivity state.

In embodiments of the present invention, by applying appropriate electrical pulses, a memory element formed of doped semiconductor material, for example the semiconductor diode of the '549 application, can achieve three, four, or more stable resistivity states. In other embodiments of the present invention, semiconductor material can be converted from an initial high-resistivity state to a lower-resistivity state; then, upon application of an appropriate electrical pulse, can be returned to a higher-resistivity state. These embodiments can be employed independently or combined to form a memory cell which can have two or more data states, and can be one-time-programmable or rewriteable.

As noted, including a diode between conductors in the memory cell allows its formation in a highly dense cross-point memory array. In preferred embodiments of the present invention, then, a polycrystalline, amorphous, or microcrystalline semiconductor memory element either is formed in series with a diode or, more preferably, is formed as the diode itself.

In this discussion, transition from a higher- to a lower-resistivity state will be called a set transition, affected by a set current, a set voltage, or a set pulse; while the reverse transition, from a lower- to a higher-resistivity state, will be called a reset transition, affected by a reset current, a reset voltage, or a reset pulse.

In preferred one-time-programmable embodiments, a polycrystalline semiconductor diode is paired with a dielectric rupture antifuse, though in other embodiments the antifuse may be omitted.

Figure 2:
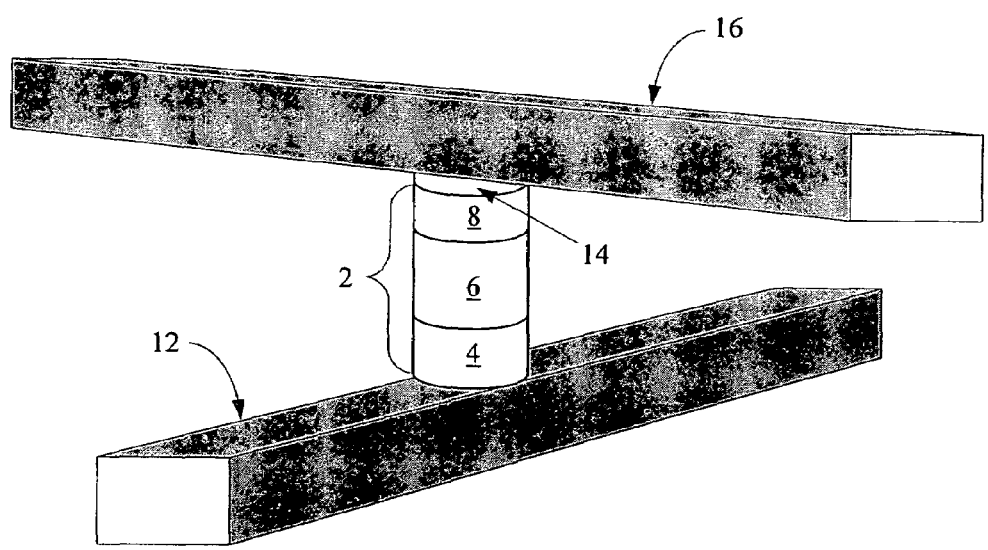
FIG. 2 is a perspective view of a multi-state or rewriteable memory cell formed according to a preferred embodiment of the present invention.
Figure 3:
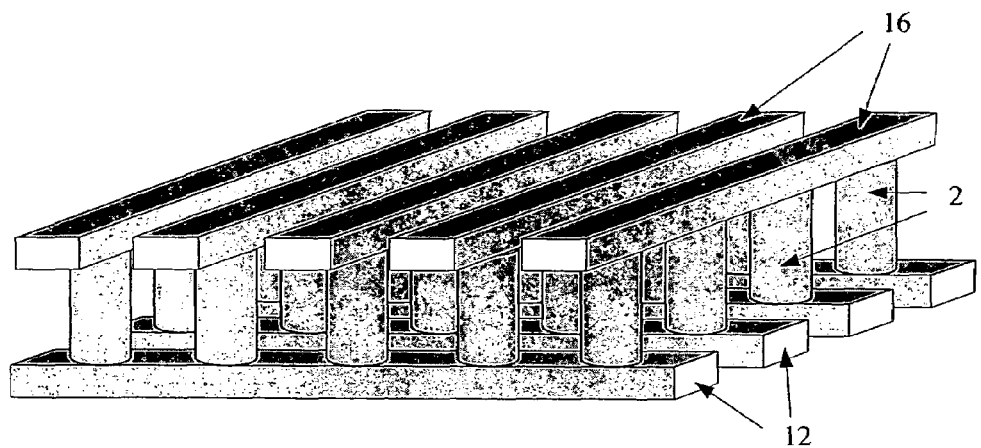
FIG. 3 is a perspective view of a portion of a memory level comprising the memory cells of FIG. 2.

FIG. 2 illustrates a memory cell formed according to a preferred embodiment of the present invention. A bottom conductor 12 is formed of a conductive material, for example tungsten, and extends in a first direction. Barrier and adhesion layers may be included in bottom conductor 12. Polycrystalline semiconductor diode 2 has a bottom heavily doped n-type region 4; an intrinsic region 6, which is not intentionally doped; and a top heavily doped region 8, though the orientation of this diode may be reversed. Such a diode, regardless of its orientation, will be referred to as a p-i-n diode. Dielectric rupture antifuse 14 is included in some embodiments. Top conductor 16 may be formed in the same manner and of the same materials as bottom conductor 12, and extends in a second direction different from the first direction. Polycrystalline semiconductor diode 2 is vertically disposed between bottom conductor 12 and top conductor 16. Polycrystalline semiconductor diode 2 is formed in a high-resistivity state. This memory cell can be formed above a suitable substrate, for example above a monocrystalline silicon wafer. FIG. 3 shows a portion of a memory level of such devices formed in a cross-point array, where diodes 2 are disposed between bottom conductors 12 and top conductors 16 (antifuses 14 are omitted in this view.) Multiple memory levels can be stacked over a substrate to form a highly dense monolithic three dimensional memory array.

In this discussion a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral.

The resistivity of doped polycrystalline or microcrystalline semiconductor material, for example silicon, can be changed between stable states by applying appropriate electrical pulses. It has been found that in preferred embodiments, set transitions are advantageously performed with the diode under forward bias, while reset transitions are most readily achieved and controlled with the diode under reverse bias. In some instances, however, set transitions may be achieved with the diode under reverse bias, while reset transitions are achieved with the diode under forward bias.

Semiconductor switching behavior is complex. For a diode, both set and reset transitions have been achieved with the diode under forward bias. Generally a reset pulse applied with the diode under forward bias which is sufficient to switch the polycrystalline semiconductor material making up a diode from a given resistivity state to a higher resistivity state will be lower amplitude than a corresponding set pulse (which will switch the same polysilicon semiconductor material from the same resistivity state to a lower resistivity state) and will have a longer pulse width.

Figure 4:
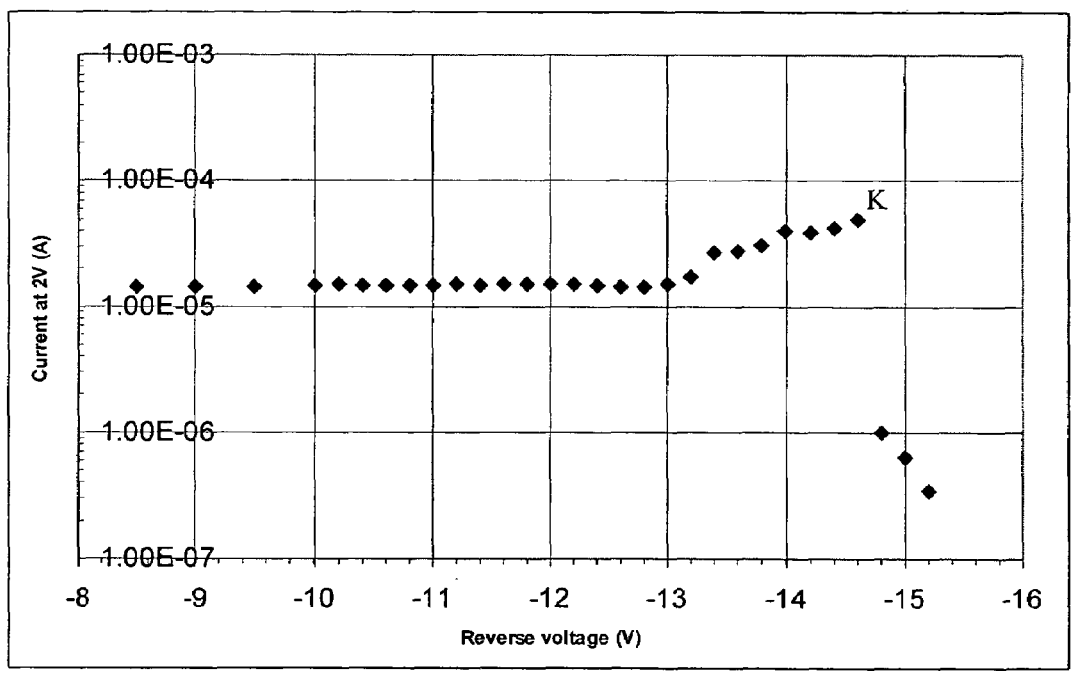
FIG. 4 is a graph showing change in read current for a memory cell of the present invention as voltage in reverse bias across the diode increases.

Switching under reverse bias shows a distinct behavior. Suppose a polysilicon p-i-n diode like the one shown in FIG. 2 is subjected to a relatively large switching pulse under reverse bias. After application of the switching pulse a smaller read pulse, for example 2 volts, is applied, and the current flowing through the diode at the read voltage, called the read current, is measured. As the voltage of the switching pulse under reverse bias is increased in subsequent pulses, the subsequent read current at two volts changes as shown in FIG. 4. It will be seen that initially as the reverse voltage and current of the switching pulse are increased, the read current, when a read voltage is applied after each switching pulse, increases; i.e. the initial transition of the semiconductor material (silicon, in this case) is in the set direction toward lower resistivity. Once the switching pulse reaches a certain reverse bias voltage, at point K in FIG. 4, about −14.6 volts in this example, the read current abruptly begins to drop as reset is achieved and resistivity of the silicon increases. The switching voltage at which the set trend is reversed and the silicon of the diode begins to reset varies, depending on, for example, the resistivity state of the silicon making up the diode when application of the reverse bias switching pulse is begun. It will be seen, then, that by selecting appropriate voltages, either set or reset of the semiconductor material making up the diode can be achieved with the diode under reverse bias.

Distinct data states of the memory cell of the present invention correspond to resistivity states of polycrystalline or microcrystalline semiconductor material making up the diode, which are distinguished by detecting current flow through the memory cell (between top conductor 16 and bottom conductor 12) when a read voltage is applied. Preferably the current flowing between any one distinct data state and any different distinct data state is at least a factor of two, to allow the difference between the states to be readily detectable.

The memory cell can be used as a one-time programmable cell or a rewriteable memory cell, and may have two, three, four, or more distinct data states. The cell can be converted from any of its data states to any other of its data states in any order, and under either forward or reverse bias.

Several examples of preferred embodiments will be provided. It will be understood, however, that these examples are not intended to be limiting. It will be apparent to those skilled in the art that other methods of programming a two-terminal device comprising a diode and polycrystalline or microcrystalline semiconductor material will fall within the scope of the invention.

One-Time Programmable Multilevel Cell

In a preferred embodiment of the present invention, a diode formed of polycrystalline semiconductor material and a dielectric rupture antifuse are arranged in series disposed between a top and bottom conductor. The two-terminal device is used as a one-time-programmable multilevel cell, in preferred embodiments having three or four distinct data states.

A preferred memory cell is shown in FIG. 2. Diode 2 is preferably formed of a polycrystalline or microcrystalline semiconductor material, for example silicon, germanium, or an alloy of silicon and/or germanium. Diode 2 is most preferably polysilicon. In this example, bottom heavily doped region 4 is n-type and top heavily doped region 8 is p-type, though the polarity of the diode may be reversed. The memory cell comprises a portion of the top conductor, a portion of the bottom conductor, and a diode, the diode disposed between the conductors.

Figure 5:
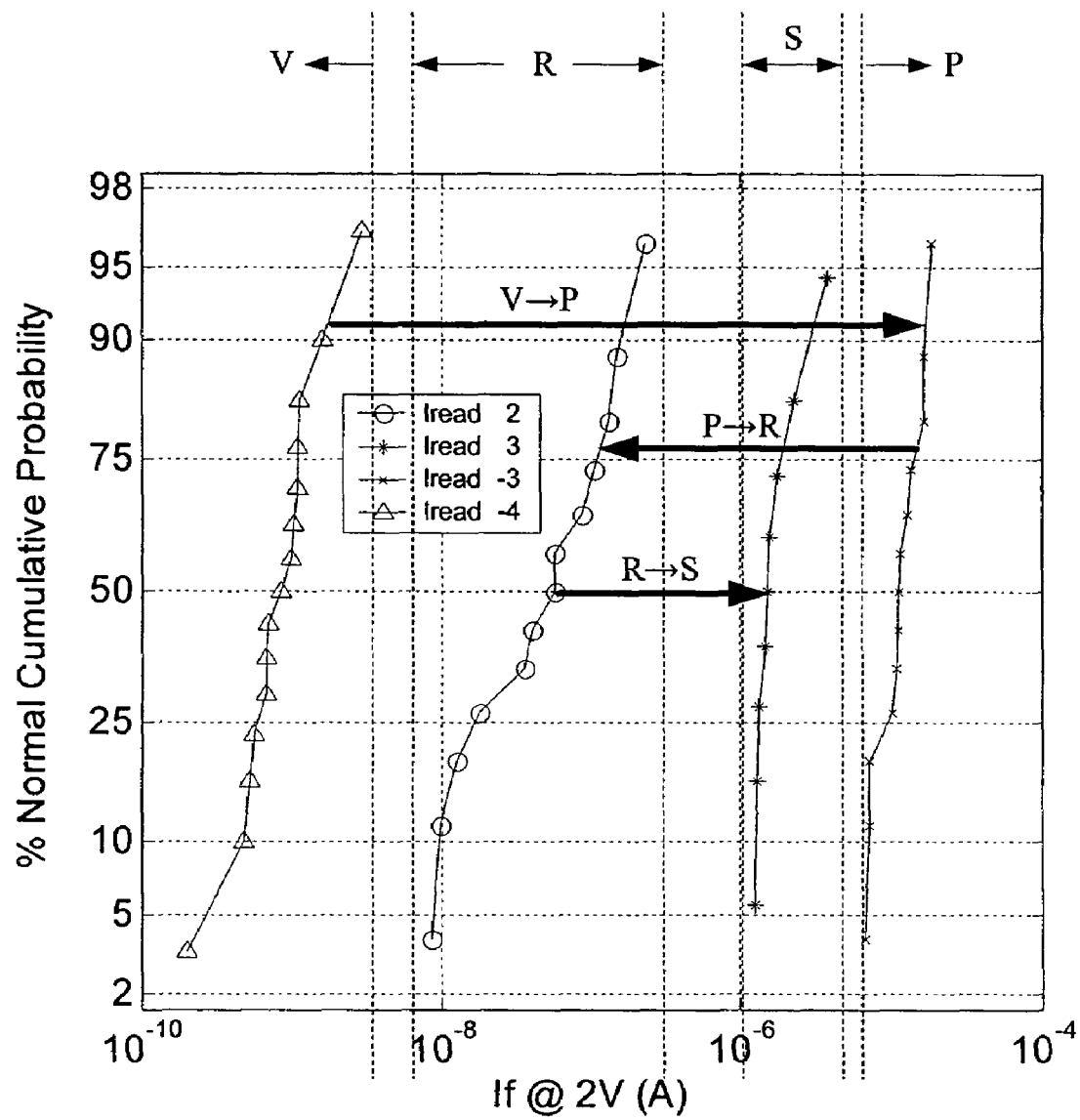
FIG. 5 is a probability plot showing memory cells transformed from the V state to the P state, from the P state to the R state, and from the R state to the S state.

As formed, the polysilicon of diode 2 is in a high-resistivity state, and dielectric rupture antifuse 14 is intact. FIG. 5 is a probability plot showing current of a memory cells in various states. Turning to FIG. 5, when a read voltage, for example 2 volts, is applied between top conductor 16 and bottom conductor 12 (with diode 2 under forward bias) the read current flowing between top conductor 16 and bottom conductor 12 is preferably in the range of nanoamps, for example less than about 5 nanoamps. Area V on the graph of FIG. 5 corresponds to a first data state of the memory cell. For some memory cells in the array, this cell will not be subjected to set or reset pulses, and this state will be read as a data state of the memory cell. This first data state will be referred to as the V state.

A first electrical pulse, preferably with diode 2 under forward bias, is applied between top conductor 16 and bottom conductor 12. This pulse is, for example, between about 8 volts and about 12 volts, for example about 10 volts. The current is, for example, between about 80 and about 200 microamps. The pulse width is preferably between about 100 and about 500 nsec. This first electrical pulse ruptures dielectric rupture antifuse 14 and switches the semiconductor material of diode 2 from a first resistivity state to a second resistivity state, the second state lower resistivity than the first. This second data state will be referred to as the P state, and this transition is labeled "V→P" in FIG. 5. The current flowing between top conductor 16 and bottom conductor 12 at a read voltage of 2 volts is about 10 microamps or more. The resistivity of the semiconductor material making up diode 2 is reduced by a factor of about 1000 to about 2000. In other embodiments the change in resistivity will be less, but between any data state and any other data state will be at least a factor of two, preferably at least a factor of three or five, and more typically a factor of 100 or more. Some memory cells in the array will be read at this data state, and will not be subjected to additional set or reset pulses. This second data state will be referred to as the P state.

A second electrical pulse, preferably with diode 2 under reverse bias, is applied between top conductor 16 and bottom conductor 12. This pulse is, for example, between about −8 volts and about −14 volts, preferably about between about −10 and about −12 volts, preferably about −11 volts. The current is, for example, between about 80 and about 200 microamps. The pulse width is, for example, between about 100 nanosec and about 10 microseconds; preferably between about 100 nsec and about 1 microsecond, most preferably between about 200 and about 800 nsec. This second electrical pulse switches the semiconductor material of diode 2 from the second resistivity state to a third resistivity state, the third resistivity state higher resistivity than the second. The current flowing between top conductor 16 and bottom conductor 12 at a read voltage of 2 volts is between about 10 and about 500 nanoamps, preferably between about 100 and about 500 nanoamps. Some memory cells in the array will be read at this data state, and will not be subjected to additional set or reset pulses. This third data state will be referred to as the R state, and this transition is labeled "P→R" in FIG. 5.

To achieve the fourth data state, a third electrical pulse, preferably with diode 2 under forward bias, is applied between top conductor 16 and bottom conductor 12. This pulse is, for example, between about 8 volts and about 12 volts, for example about 10 volts, with current between about 5 and about 20 microamps. This third electrical pulse switches the semiconductor material of diode 2 from the third resistivity state to a fourth resistivity state, the fourth resistivity state lower resistivity than the third, and preferably higher resistivity than the second resistivity state. The current flowing between top conductor 16 and bottom conductor 12 at a read voltage of 2 volts is between about 1.5 and about 4.5 microamps. Some memory cells in the array will be read at this data state, which will be referred to as the S state, and this transition is labeled "R→S" in FIG. 5.

The difference in current at the read voltage (for example 2 volts) is preferably at least a factor of two between any two adjacent data states. For example, the read current of any cell in data state R is preferably at least two times that of any cell in data state V, the read current of any cell in data state S is preferably at least two times that of any cell in data state R, and the read current of a cell in data state P is preferably at least two times that of any cell in data state S. For example, the read current at data state R may be two times the read current at data state V, the read current at data state S may be two times the read current at data state R, and the read current at data state P may be two times the read current at data state S. If the ranges are defined to be smaller, the difference could be considerably larger; for example, if the highest-current V state cell can have a read current of 5 nanoamps and the lowest-current R state call can have a read current of 100 nanoamps, the difference in current is at least a factor of 20. By selecting other limits, it can be assured that the difference in read current between adjacent memory states will be at least a factor of three.

As will be described later, an iterative read-verify-write process may be applied to assure that a memory cell is in one of the defined data states after a set or reset pulse, and not between them.

So far the difference between the highest current in one data state and the lowest current in the next highest adjacent data state has been discussed. The difference in read current in most cells in adjacent data states will be larger still; for example a memory cell in the V state may have a read current of 1 nanoamp, a cell in the R state may have a read current of 100 nanoamps, a cell in the S state may have a read current of 2 microamps (2000 nanoamps), and a cell in the P state may have a read current of 20 microamps. These currents in each adjacent state differ by a factor of ten or more.

A memory cell having four distinct data states has been described. To aid in distinguishing between the data states, it may be preferred for three rather than four data states to be selected. Four example, a three-state memory cell can be formed in data state V, set to data state P, then reset to data state R. This cell will have no fourth data state S. In this case the difference between adjacent data states, for example between the R and P data states, can be significantly larger.

A one-time programmable memory array of memory cells as described, each cell programmed to one of three distinct data states (in one embodiment) or one of four distinct data states (in an alternative embodiment), can be programmed as described. These are only examples; clearly there could be more than three or four distinct resistivity states and corresponding data states.

Figure 6:
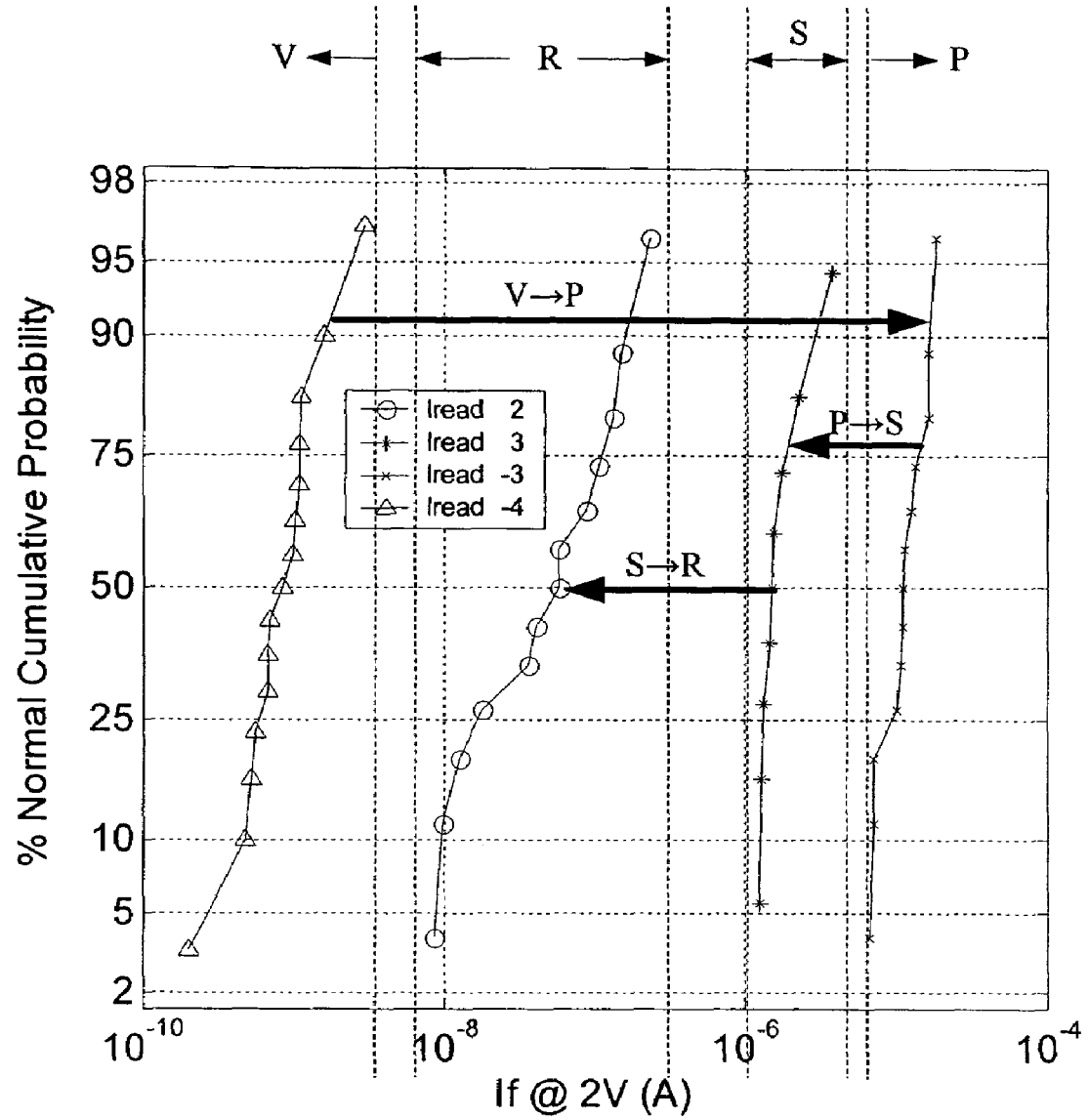
FIG. 6 is a probability plot showing memory cells transformed from the V state to the P state, from the P state to the S state, and from the S state to the R state.

In a memory array of one-time programmable memory cells, the cells may be programmed in a variety of ways, however. For example, turning to FIG. 6, the memory cell of FIG. 2 may be formed in a first state, the V state. A first electrical pulse, preferably under forward bias, ruptures antifuse 14 and switches the polysilicon of the diode from a first resistivity state to a second resistivity state lower than the first, placing the memory cell in the P state, which in this example is the lowest resistivity state. A second electrical pulse, preferably under reverse bias, switches the polysilicon of the diode from the second resistivity state to a third resistivity state, the third resistivity state higher resistivity than the second, placing the memory cell in the S state. A third electrical pulse, preferably also under reverse bias, switches the polysilicon of the diode from the third resistivity state to a fourth resistivity state, the third resistivity state higher resistivity than the second, placing the memory cell in the R state. For any given memory cell, any of the data states, the V state, the R state, the S state, and the P state, can be read as a data state of the memory cell. Each transition is labeled in FIG. 6. Four distinct states are shown; there could be three or more than four states as desired.

Figure 7:
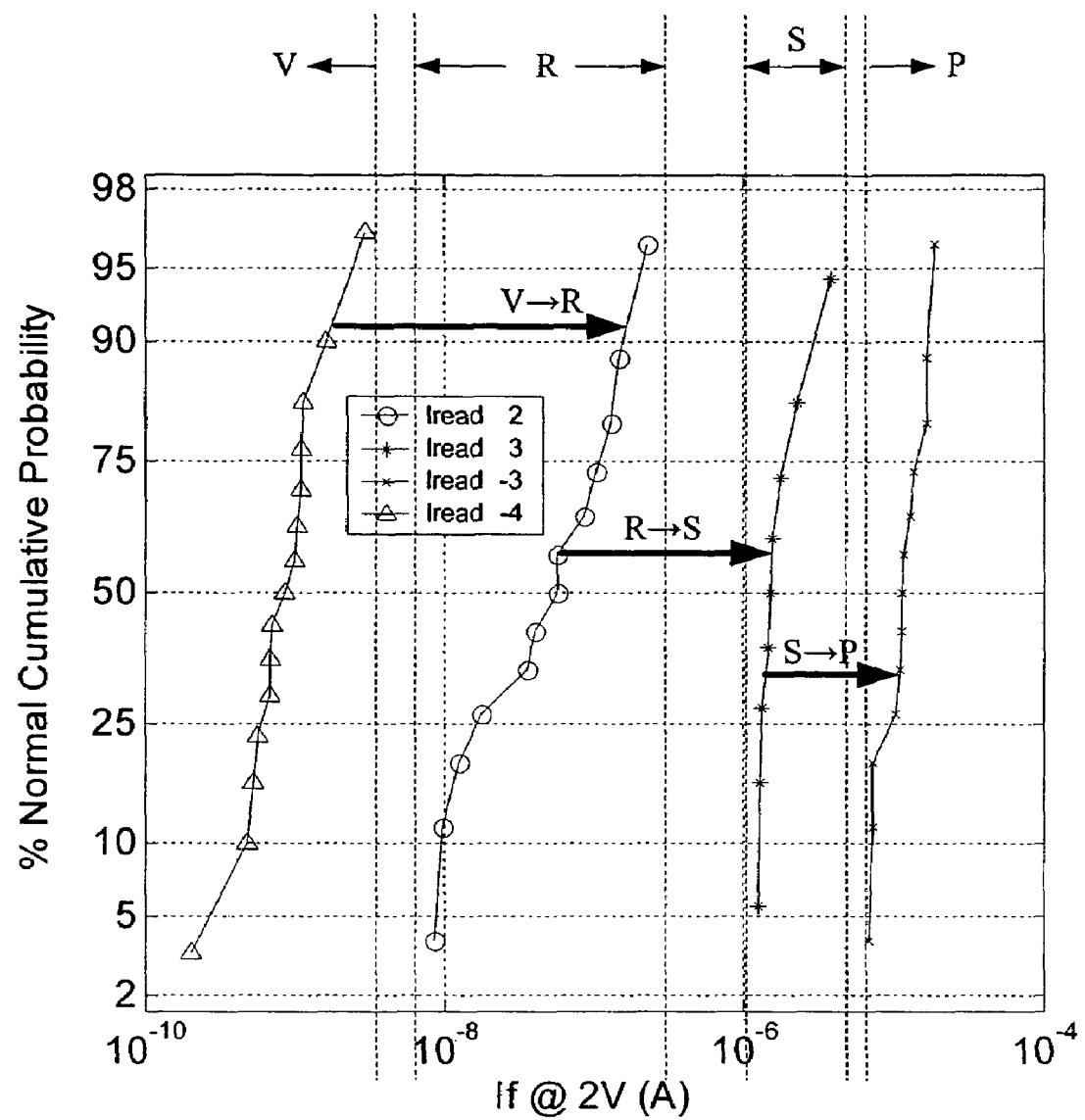
FIG. 7 is a probability plot showing memory cells transformed from the V state to the R state, from the R state to the S state, and from the S state to the P state.

In still other embodiments, each successive electrical pulse can switch the semiconductor material of the diode to a successively lower resistivity state. As in FIG. 7, for example, the memory cell can proceed from the initial V state to the R state, from the R state to the S state, and from the S state to the P state, where for each state the read current is at least two times the read current at the previous state, each corresponding to a distinct data state. This scheme may be most advantageous when there is no antifuse included in the cell. In this example the pulses may be applied under either forward or reverse bias. In alternative embodiments there may be three data states or more than four data states.

Figure 8:
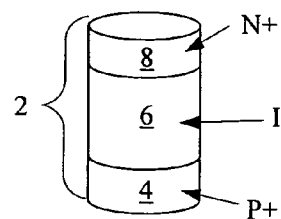
FIG. 8 is a perspective view of a vertically oriented p-i-n diode that may be used in embodiments of the present invention.

In one embodiment, a memory cell includes the polysilicon or microcrystalline diode 2 shown in FIG. 8, including bottom heavily doped p-type region 4, middle intrinsic or lightly doped region 6, and top heavily doped n-type region 8. As in prior embodiments, this diode 2 can be arranged in series with a dielectric rupture antifuse, the two disposed between top and bottom conductors. Bottom heavily doped p-type region 4 may be in situ doped, i.e. doped by flowing a gas that provides a p-type dopant such as boron during deposition of the polysilicon, such that dopant atoms are incorporated into the film as it forms.

Figure 9:
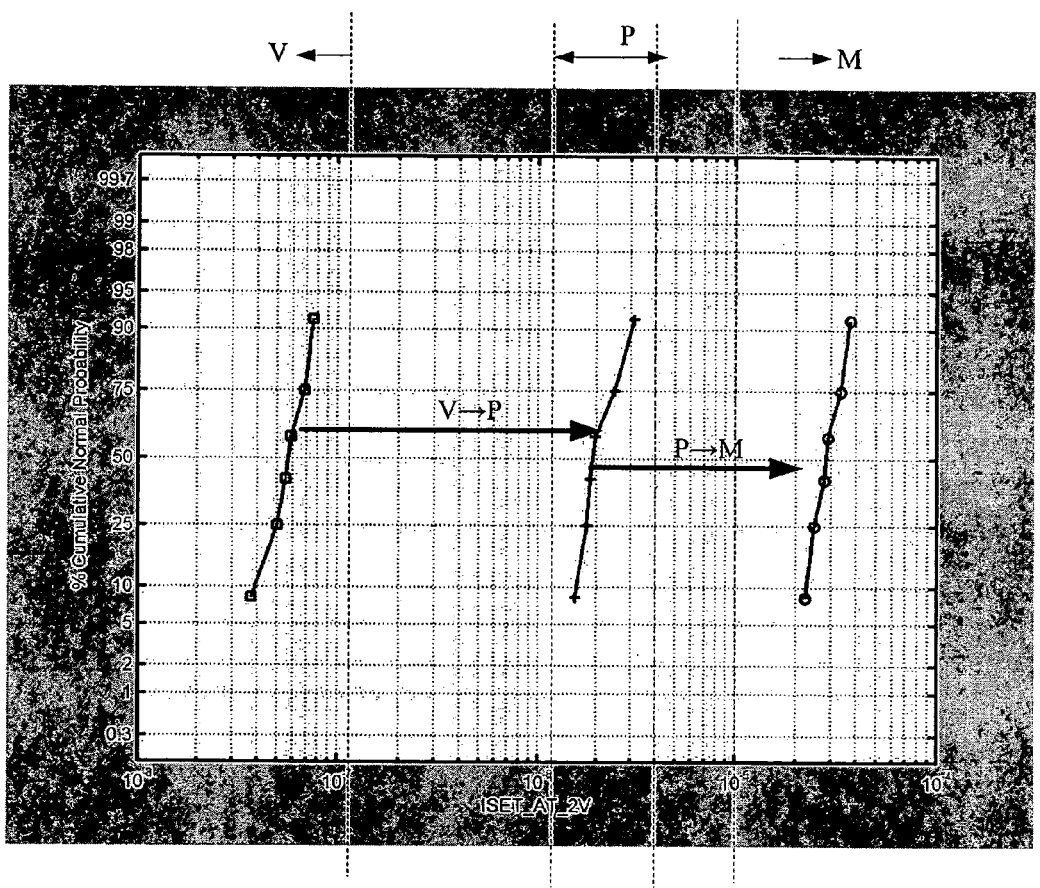
FIG. 9 is a probability plot showing memory cells transformed from the V state to the P state, and from the P state to the M state.

Turning to FIG. 9, it has been found that this memory cell is formed in the V state, where the current between top conductor 16 and bottom conductor 12 is less than about 80 nanoamps at a read voltage of 2 volts. A first electrical pulse, preferably applied under forward bias of, for example, about 8 volts, ruptures dielectric rupture antifuse 14, if it is present, and switches the polysilicon of diode 2 from a first resistivity state to a second resistivity state, the second resistivity state lower than the first, placing the memory cell in data state P. In data state P, the current between top conductor 16 and bottom conductor 12 at the read voltage is between about 1 microamp and about 4 microamps. A second electrical pulse, preferably applied in reverse bias, switches the polysilicon of diode 2 from the second resistivity state to a third resistivity state, the third resistivity state lower than the first. The third resistivity state corresponds to data state M. In data state M, the current between top conductor 16 and bottom conductor 12 at the read voltage is above about 10 microamps. As in prior embodiments, the difference in current between any cell in adjacent data states (the highest-current cell of state V and the lowest-current cell of state P, or between the highest-current cell of state P and the lowest-current cell of state M) is preferably at least a factor of two, preferably a factor of three or more. Any of the data states V, P, or M can be detected as a data state of the memory cell.

FIG. 4 showed that when a semiconductor diode is subjected to reverse bias, in general the semiconductor material initially undergoes a set transition to lower resistivity, then, as voltage is increased, undergoes a reset transition to higher resistivity. For this particular diode, with top heavily doped n-type region 8, and preferably with bottom heavily doped region 4 formed by in situ doping with a p-type dopant, the switch from set transition to reset transition with increasing reverse bias voltage does not occur as abruptly or as steeply as with other embodiments of the diode. This means a set transition under reverse bias is easier to control with such a diode.

Rewritable Memory Cell

In another set of embodiments, the memory cell behaves as a rewriteable memory cell, which is repeatably switchable between two or between three data states.

Figure 10:
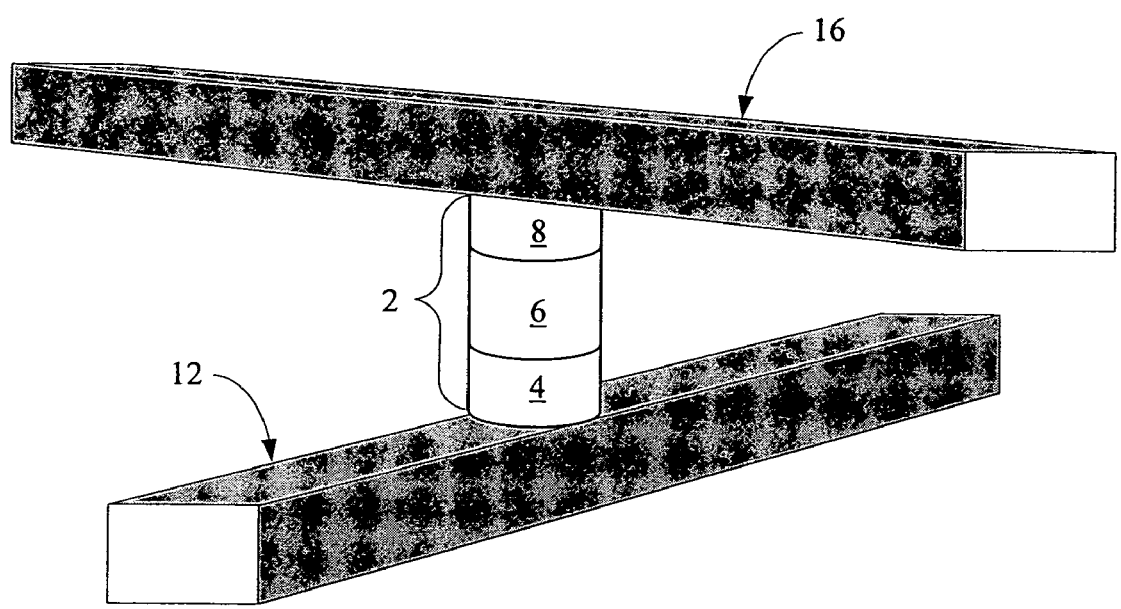
FIG. 10 is a perspective view of a multi-state or rewriteable memory cell formed according to a preferred embodiment of the present invention.

FIG. 10 shows a memory cell that may serve as a rewriteable memory cell. This memory cell is the same as the one shown in FIG. 2, except no dielectric rupture antifuse is included. Most rewriteable embodiments do not include an antifuse in the memory cell, though one may be included if desired.

Figure 11:
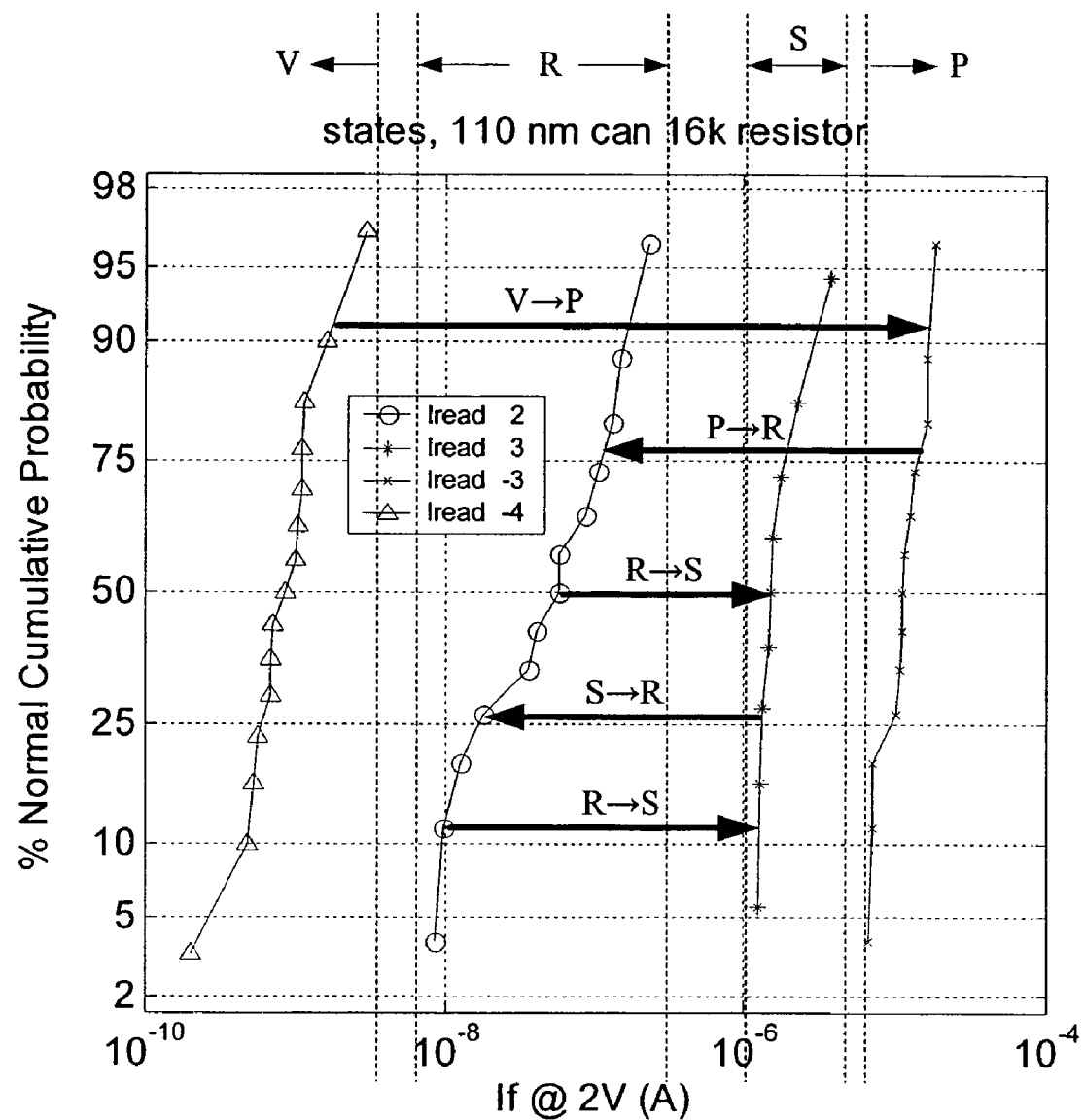
FIG. 11 is a probability plot showing memory cells transformed from the V state to the P state, from the P state to the R state, and from the R state to the S state, then repeatably between the S state and the R state.

Turning to FIG. 11, in a first preferred embodiment, the memory cell is formed in a high resistivity state V, with current at 2 volts about 5 nanoamps or less. For most rewriteable embodiments the initial V state does not serve as a data state of the memory cell. A first electrical pulse, preferably with diode 2 under forward bias, is applied between top conductor 16 and bottom conductor 12. This pulse is, for example, between about 8 and about 12 volts, preferably about 10 volts. This first electrical pulse switches the semiconductor material of diode 2 from a first resistivity state to a second resistivity state P, the second state lower resistivity than the first. In preferred embodiments, the P state also will not serve as a data state of the memory cell. In other embodiments, the P state will serve as a data state of the memory cell.

A second electrical pulse, preferably with diode 2 under reverse bias, is applied between top conductor 16 and bottom conductor 12. This pulse is, for example, between about −8 and about −14 volts, preferably between about −9 and about −13 volts, more preferably about −10 or −11 volts. The voltage required will vary with the thickness of the intrinsic region. This second electrical pulse switches the semiconductor material of diode 2 from the second resistivity state to a third resistivity state R, the third state higher resistivity than the second. In preferred embodiments the R state corresponds to a data state of the memory cell.

A third electrical pulse can be applied between top conductor 16 and bottom conductor 12, preferably under forward bias. This pulse is, for example, between about 5.5 and about 9 volts, preferably about 6.5 volts, with current between about 10 and about 200 microamps, preferably between about 50 and about 100 microamps. This third electrical pulse switches the semiconductor material of diode 2 from the third resistivity state R to a fourth resistivity state S, the fourth state lower resistivity than the third. In preferred embodiments the S state corresponds to a data state of the memory cell.

In this rewriteable, two-state embodiment, the R state and the S state are sensed, or read, as data states. The memory cell can repeatedly be switched between these two states. For example, a fourth electrical pulse, preferably with diode 2 under reverse bias, switches the semiconductor material of the diode from the fourth resistivity state S to the fifth resistivity state R, which is substantially the same as the third resistivity state R. A fifth electrical pulse, preferably with diode 2 under forward bias, switches the semiconductor material of the diode from the fifth resistivity state R to the sixth resistivity state S, which is substantially the same as the fourth resistivity state S, and so on. It may be more difficult to return the memory cell to the initial V state and the second P state; thus these states may not be used as data states in a rewriteable memory cell. It may be preferred for both the first electrical pulse, which switches the cell from the initial V state to the P state, and the second electrical pulse, which switches the cell from the P state to the R state, to be performed before the memory array reaches the end user, for example in a factory or test facility, or by a distributor before sale. In other embodiments, it may be preferred for only the first electric pulse, which switches the cell from the initial V state to the P state, to be performed before the memory array reaches the end user.

As will be seen from FIG. 11, in the example provided, the difference between current flow under read voltage, for example of 2 volts, between top conductor 16 and bottom conductor 12 between any cell in one data state and any cell in an adjacent data states, in this case the R data state (between about 10 and about 500 nanoamps) and the S data state (between about 1.5 and about 4.5 microamps), is at least a factor of three. Depending on the ranges selected for each data state, the difference may be a factor of two, three, five, or more.

In alternative embodiments, a rewriteable memory cell can be switched between three or more data states, in any order. Either set or reset transitions can be performed with the diode under either forward or reverse bias.

In both the one-time programmable and rewriteable embodiments described, note that the data state corresponds to the resistivity state of polycrystalline or microcrystalline semiconductor material making up a diode. The data states does not correspond to the resistivity state of a resistivity-switching metal oxide or nitride, as in Herner et al., U.S. patent application Ser. No. 11/395,995, "Nonvolatile Memory Cell Comprising a Diode and a Resistance-Switching Material," filed Mar. 31, 2006, owned by the assignee of the present invention and hereby incorporated by reference.

Reverse Bias Set and Reset

In an array of memory cells formed and programmed according to the embodiments described so far, any step in which cells are subjected to large voltages in reverse bias has reduced leakage current as compared to a forward bias step.

Figure 12:
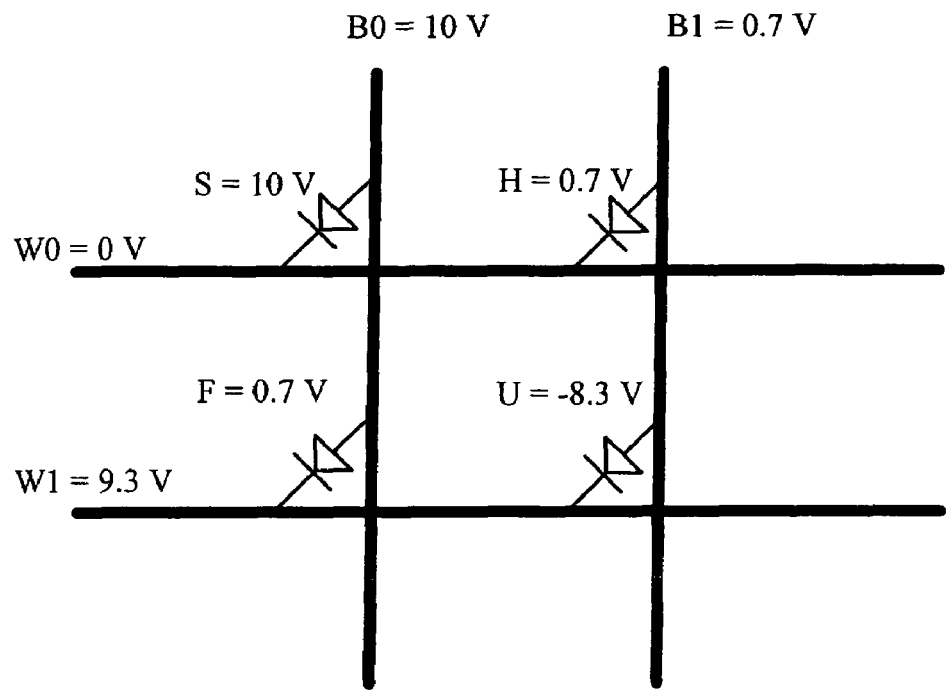
FIG. 12 is a circuit diagram showing a biasing scheme to bias the S cell in forward bias.

Turning to FIG. 12, suppose 10 volts is to be applied in forward bias across the selected cell S. (The actual voltage to be used will depend on many factors, including the construction of the cell, dopant levels, height of the intrinsic region, etc.; 10 volts is merely an example.) Bitline B0 is set at 10 volts and wordline W0 is set at ground. To assure that half-selected cells F (which share bitline B0 with selected cell S) remain below the turn-on voltage of the diode, wordline W1 is set less than but relatively close to the voltage of bitline B0; for example wordline W1 may be set to 9.3 volts, so that 0.7 volts is applied across the F cells (only one F cell is shown, but there may be hundreds, thousands or more.) Similarly, to assure that half-selected cells H (which share wordline W0 with selected cell S) remain below the turn-on voltage of the diode, bitline B1 is set higher than but relatively close to the voltage of wordline W0; for example bitline B1 may be set to 0.7 volts, so that 0.7 volts is applied across cell H (again, there may be thousands of H cells.) The unselected cells U, which share neither wordline W0 or bitline B0 with selected cell S, are subjected to −8.6 volts. As there may be millions of unselected cells U, this results in significant leakage current within the array.

Figure 13:
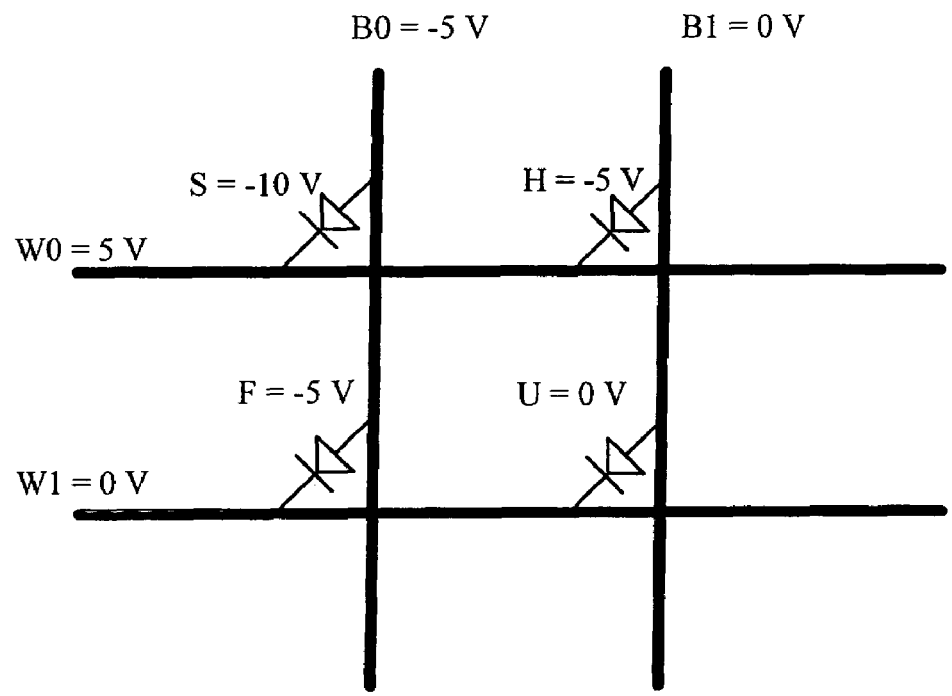
FIG. 13 is a circuit diagram showing one biasing scheme to bias the S cell in reverse bias.

FIG. 13 shows an advantageous biasing scheme to apply a large reverse bias across a memory cell, for example as a reset pulse. Bitline B0 is set at −5 volts and wordline W0 at 5 volts, so that −10 volts is applied across selected cell S; the diode is in reverse bias. Setting wordline W1 and bitline B1 at ground subjects both half-selected cells F and H to −5 volts, at a reverse bias low enough not to cause unintentional set or reset of these cells. Set or reset in reverse bias generally seems to take place at or near the voltage at which the diode goes into reverse breakdown, which is generally higher than −5 volts.

With this scheme, there is no voltage across the unselected cells U, resulting in no reverse leakage. As a result, as described further in, for example, Scheuerlein et al., U.S. application Ser. No. 11/461,352, "Dual Data-Dependent Busses for Coupling Read/Write Circuits to a Memory Array,", filed on even day herewith and earlier incorporated by reference, bandwidth can be increased significantly.

The biasing scheme of FIG. 13 is just one example; clearly many other schemes can be used. For example bitline B0 can be set at 0 volts, wordline W0 at −10 volts, and bitline B1 and wordline W1 at −5 volts. The voltage across selected cell S, half-selected cells H and F, and unselected cells U will be the same as in the scheme of FIG. 13. In another example, bitline B0 is set at ground, wordline W0 at 10 volts, and bitline B1 and wordline W1 each at 5 volts.

Iterative Set and Reset

So far this discussion has described applying an appropriate electrical pulse to switch the semiconductor material of a diode from one resistivity state to a different resistivity state, thus switching the memory cell between two distinct data states. In practice, these set and reset steps may be iterative processes.

As described, the difference between current flow during read in adjacent data states is preferably at least a factor of two; in many embodiments, it may be preferred to establish current ranges for each data state which are separated by a factor of three, five, ten, or more.

Figure 14:
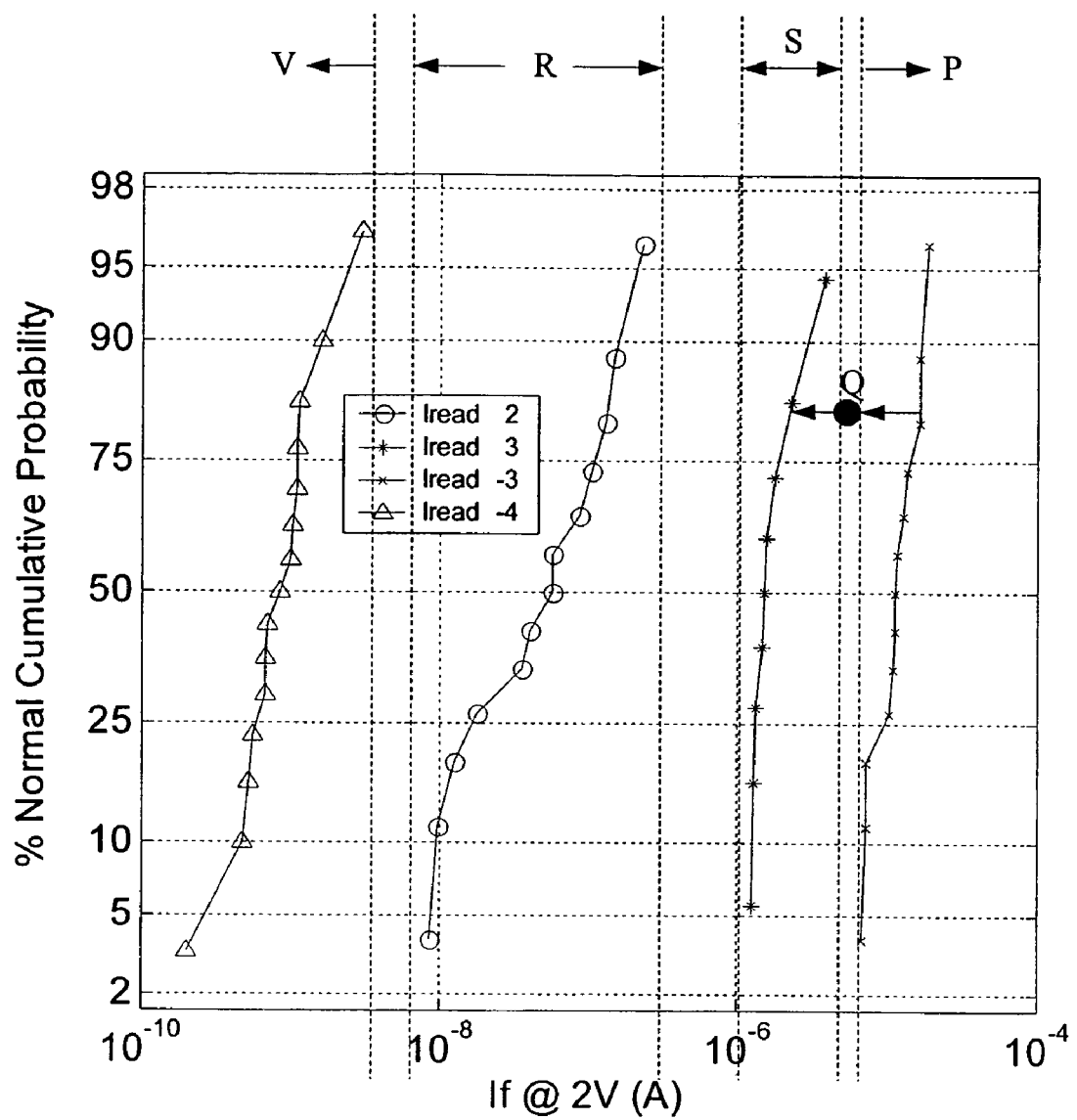
FIG. 14 illustrates iterative read-verify-write cycles to move a cell into a data state.

Turning to FIG. 14, as described, data state V may be defined as read current of 5 nanoamps or less at a read voltage of 2 volts, data state R as read current between about 10 and about 500 nanoamps, data state S as read current between about 1.5 and about 4.5 microamps, and data state P as read current above about 10 microamps. Those skilled in the art will appreciate that these are examples only. In another embodiment, for example, data state V may be defined in a smaller range, with read current about 5 nanoamps or less at a read voltage of 2 volts. Actual read currents will vary with characteristics of the cell, construction of the array, read voltage selected, and many other factors.

Suppose a one-time programmable memory cell is in data state P. An electrical pulse in reverse bias is applied to the memory cell to switch the cell into data state S. In some instances, however, it may be that after application of the electrical pulse, the read current is not in the desired range; i.e. the resistivity state of the semiconductor material of the diode is higher or lower than intended. For example, suppose after application of the electrical pulse, the read current of the memory cell is at the point on the graph shown at Q, in between the S state and P state current ranges.

After an electrical pulse is applied to switch the memory cell to a desired data state, the memory cell may be read to determine if the desired data state was reached. If the desired data state was not reached, an additional pulse is applied. For example, when the current Q is sensed, an additional reset pulse is applied to increase the resistivity of the semiconductor material, decreasing the read current into the range corresponding to the S data state. As described earlier, this set pulse may be applied in either forward or reverse bias. The additional pulse or pulses may have a higher amplitude (voltage or current) or longer or shorter pulse width than the original pulse. After the additional set pulse, the cell is read again, then set or reset pulses applied as appropriate until the read current is in the desired range.

In a two-terminal device, such as the memory cell including a diode described, it will be particularly advantageous to read in order to verify the set or reset and to adjust if necessary. Applying a large reverse bias across the diode may damage the diode; thus when performing a set or reset with the diode under reverse bias, it is advantageous to minimize the reverse bias voltage.

Fabrication Considerations

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

When, in contrast, an amorphous or microcrystalline silicon material is crystallized not in contact with a silicon having a silicide with which it has a good lattice match, for example in contact only with materials such as silicon dioxide and titanium nitride, with which it has a significant lattice mismatch, the resulting polysilicon will have many more defects, and doped polysilicon crystallized this way will be much less conductive as formed.

In aspects of the present invention, the semiconductor material forming a diode is switched between two or more resistivity states, changing the current flowing through the diode at a given read voltage, the different currents (and resistivity states) corresponding to distinct data states. It has been found that diodes formed of high-defect silicon (or other appropriate semiconductor materials such as germanium or silicon-germanium alloys) which has not been crystallized adjacent to a silicide or analogous material providing a crystallization template exhibit the most advantageous switching behavior.

Without wishing to be bound by any particular theory, it is believed that one possible mechanism behind the observed changes in resistivity is that set pulses above the threshold amplitude cause dopant atoms to move out of grain boundaries, where they are inactive, into the body of a crystal where they will increase conductivity and lower the resistance of the semiconductor material. In contrast, reset pulses may cause dopant atoms to move back to the grain boundaries, lowering conductivity and increasing resistance. It may be, however, that other mechanisms, such as an increase and decrease in degree of order of the polycrystalline material, are operating as well or instead.

It has been found that the resistivity state of very low-defect silicon crystallized adjacent to an appropriate silicide cannot be switched as readily as when the semiconductor material has a higher level of defects. It may be that the presence of defects, or of a larger number of grain boundaries, allows for easier switching. In preferred embodiments, then, the polycrystalline or microcrystalline material forming the diode is not crystallized adjacent to a material with which it has a small lattice mismatch. A small lattice mismatch is, for example, a lattice mismatch of about three percent or less.

Evidence has suggested that switching behavior may be centered on changes in the intrinsic region. Switching behavior has been observed in resistors and p-n diodes as well, and is not limited to p-i-n diodes, but it is believed that the use of p-i-n diodes may be particularly advantageous. The embodiments described so far included a p-i-n diode. In other embodiments, however, the diode may be a p-n diode instead, with little or no intrinsic region.

A detailed example will be provided describing fabrication of a preferred embodiment of the present invention. Fabrication details from Herner et al., U.S. patent application Ser. No. 10/320,470, "An Improved Method for Making High Density Nonvolatile Memory," filed Dec. 19, 2002, and since abandoned, hereby incorporated by reference, will be useful in formation of the diode of these embodiments, as will information from the '549 application. Useful information may also be derived from Herner et al., U.S. patent application Ser. No. 11/015,824, "Nonvolatile Memory Cell Comprising a Reduced Height Vertical Diode," filed Dec. 17, 2004, assigned to the assignee of the present invention and hereby incorporated by reference. To avoid obscuring the invention not all of the detail from these applications will be included, but it will be understood that no information from these applications is intended to be excluded.

EXAMPLE

Fabrication of a single memory level will be described in detail. Additional memory levels can be stacked, each monolithically formed above the one below it. In this embodiment, a polycrystalline semiconductor diode will serve as the switchable memory element.

Figure 15A:
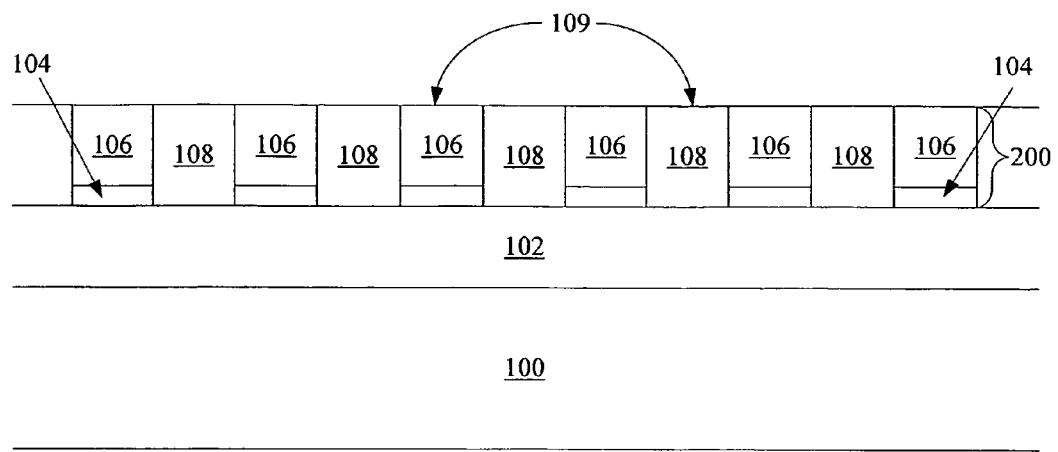
FIGS. 15a-15c are cross-sectional views illustrating stages in formation of a memory level formed according to an embodiment of the present invention.

Turning to FIG. 15a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 15a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 15a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 15B:
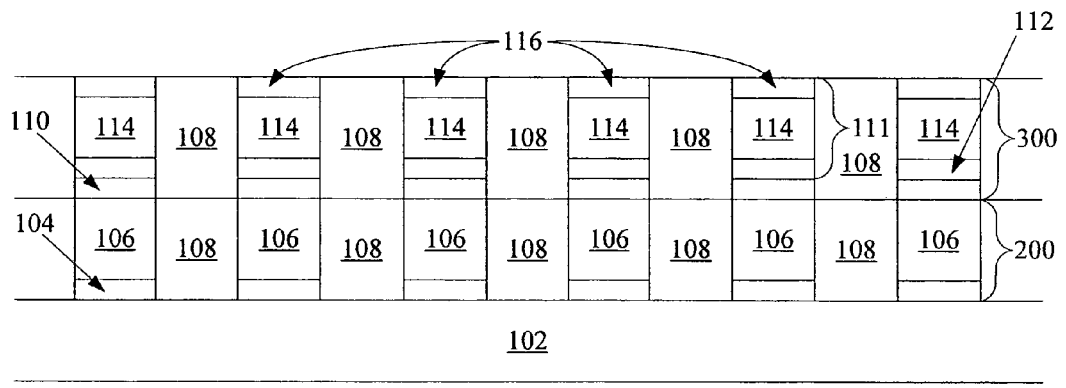

Next, turning to FIG. 15b, vertical pillars will be formed above completed conductor rails 200. (To save space substrate 100 is not shown in FIG. 15b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3300 angstroms, preferably about 2000 angstroms.

Returning to FIG. 15b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. This implant step completes formation of diodes 111. The resulting structure is shown in FIG. 15b. In the diodes just formed, bottom heavily doped regions 112 are n-type while top heavily doped regions 116 are p-type; clearly the polarity could be reversed.

Figure 15C:
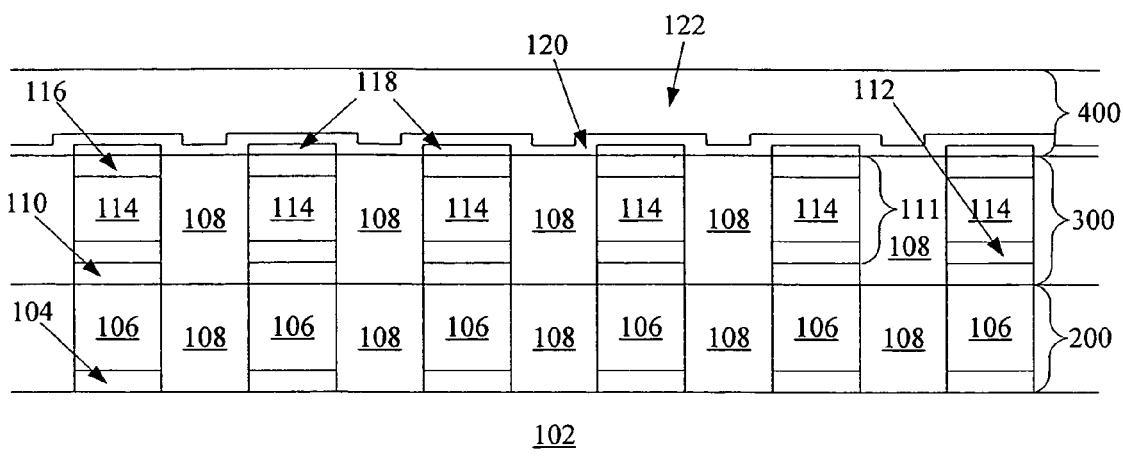

Turning to FIG. 15c, next dielectric rupture antifuse layer 118 is formed on top of each heavily doped region 116. Antifuse 118 is preferably a silicon dioxide layer formed by oxidizing the underlying silicon in a rapid thermal anneal, for example at about 600 degrees. Antifuse 118 may be about 20 angstroms thick. Alternatively, antifuse 118 can be deposited.

Top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 15c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 15c, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

Alternative Embodiments

In addition to those already described, many alternative embodiments of a memory cell having its data state stored in the resistivity state of polycrystalline or microcrystalline semiconductor material are possible and fall within the scope of the invention. A few other possible embodiments will be mentioned, but this list cannot and is not intended to be exhaustive.

Figure 16:
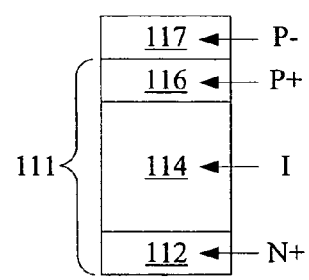
FIG. 16 is cross-sectional view illustrating a diode and resistive switching element that may be used an alternative embodiment of the present invention.

FIG. 16 shows a switchable memory element 117 formed in series with a diode 111. The switchable memory element 117 is formed of semiconductor material which is switched between resistivity states using electrical pulses as described. The diode is preferably crystallized adjacent to a silicide such as cobalt silicide, which provides a crystallization template, as described earlier, such that the semiconductor material of the diode is very low-defect and exhibits little or no switching behavior. Switchable memory element 117 is preferably doped, and should be doped to the same conductivity type as top heavily doped region 116. Methods to fabricate this device are described in the '167 application.

Detailed methods of fabrication have been described herein, but any other methods that form the same structures can be used while the results fall within the scope of the invention.

Exemplary Applications

The above embodiments describe how a single memory cell can be used as a two-data-state memory cell, a more-than-two-data-state memory cell, a one-time programmable memory cell, or a rewritable memory cell. This versatility allows a common memory cell architecture to be used to provide multiple types of memory products. The following is a discussion of the multi-use nature of the memory cell and its potential to provide a mixed-use memory array.

The memory cell described above has a memory element comprising a switchable resistance material, such as a semiconductor material, that is configurable to one of at least three resistivity states. A memory element can be "configured" to a resistivity state during the formation of the memory element (e.g., the initial, unprogrammed state of a memory element has an initial resistivity state) or by subsequently subjecting the memory element to set or reset pulses. Because of this characteristic, a single memory cell can act in two different ways: as a one-time programmable memory cell or a rewritable memory cell. Also because of this characteristic, a single memory cell can use two data states or more than two data states. Accordingly, any given manufactured memory cell has the potential of being operable as a one-time programmable memory cell or a rewritable memory cell with two or more data states.

As shown in the figures and discussion above, there is one resistivity state that is used to represent a data state of a memory cell when the memory cell operates as a one-time programmable memory cell but not when the memory cell operates as a rewritable memory cell. In other words, there is an "extra" state possible in the memory cell when the memory cell is used as a one-time programmable memory cell. For example, with reference to the memory cell described above and in conjunction with FIGS. 5 and 11, the memory cell is manufactured in an initial resistivity state (the V state), and this resistivity state is used when the memory cell operates as a one-time programmable memory cell but not when the memory cell operates as a rewritable memory cell. Two other data states (the R and S states) are used to represent data states of the memory cell when the memory cell operates as a rewritable memory cell. (As described below, these data states can also be used in a one-time programmable memory cell.) These data states are achieved by varying the resistance of the switchable resistance material. Again, these other data states do not include the data state that is only used to represent a data state when the memory cell operates as a one-time programmable memory cell. Additional data state(s) (e.g., an "R2" data state between the R state and the S state) can be used to allow a rewritable memory cell to achieve three or more respective data states.

It should be noted that, in one preferred embodiment, the memory element comprises a switchable resistance material (e.g., a semiconductor material) in series with an antifuse, and the V state is the resistivity state used only when the memory cell operates as a one-time programmable memory cell. This is because, once the antifuse is blown, the memory element cannot go back to the V state. However, even when an antifuse is not used, one resistivity state can be designated as the state that is only used when the memory cell operates as a one-time programmable memory cell. It should also be noted that the P state can also be a resistivity state that is used when the memory cell operates as a one-time programmable memory cell but not when the memory cell operates as a rewritable memory cell. However, in some embodiments, instead of or in addition to the P state, one or both of the R and S states are used to represent a data state of a one-time programmable memory cell, such as when the one-time programmable memory cell stores three or four data states. In such a situation, the one-time programmable and rewritable uses of the memory cell would have a resistivity state in common. For example, instead of a one-time programmable memory cell and a rewritable memory cell having unique states (e.g., the V state and the P state for one-time programmable, and the R state and the S state for rewritable), a one-time programmable memory cell can have one state in common with a rewritable memory cell (e.g., where there is no distinction between the S state and the P state). Nevertheless, there would still be at least one resistivity state (e.g., the V state) that would be used to represent a data state of the memory cell when the memory cell operates as a one-time programmable memory cell but not when the memory cell operates as a rewritable memory cell.

One advantage of this versatility is that a single integrated circuit with such memory cells can be designated either as a one-time programmable memory array or as a rewritable memory array. This provides flexibility in manufacturing and yield enhancement. To determine whether a memory array should be used as a one-time programmable memory array or as a rewritable memory array, a set of test memory cells (e.g., test rows and columns) in the memory array can be tested during manufacturing (or after). For example, the test memory cells can be exercised by repeatedly programming, resetting, and setting the memory cells. U.S. Pat. No. 6,407, 953, which is assigned to the assignee of the present invention and is hereby incorporated by reference, describes a suitable testing technique. Based on the results of this testing, one can predict whether or not the memory array will program correctly as a rewritable memory array. For example, if the testing shows difficulty in distinguishing between the R and S states, which are used when the memory array operates as a rewritable memory array, the part will probably not program correctly as a rewritable memory array. However, because the cells in the memory array can operate as either one-time programmable memory cells or rewritable memory cells, instead of discarding the part because it did not provide the expected rewritable yield, the part can be designated as a one-time programmable memory array. Accordingly, the common backbone architecture of the memory cells provides flexibility in manufacturing and yield enhancement.

At this point, there can be a divergence in manufacturing. Memory arrays passing the test can go on to further formatting (e.g., all the memory cells being programmed from the V state to the P state, then exercised between the R and S states as a final qualification test) and then shipping to a store or end user as a rewritable memory array (e.g., a memory card for a digital camera). Memory arrays failing the test can be packaged and sent to a different part of the factory for programming one-time programmable content. Alternatively, the part can be sent to a store, with a store employee or end user field programming one-time programmable content (e.g., using a kiosk). The unprogrammed part can also be sold to the end user for use as archival memory.

It is preferred that a flag be used to signal a device that reads and writes to the memory array (e.g., a controller on the memory device that includes the memory array or hardware/software in a host device) that the memory array is one-time programmable or rewritable. The "flag" can be one or more bits stored in the memory array. For example, a flag can be set in a special address location in the memory array (e.g., address 0000). When the host device detects the flag, it can adapt to the one-time programmable nature of the memory array by not attempting to reprogram it.

Instead of using the entire memory array as either a one-time programmable memory array or a rewritable memory array, the memory array can be a "mixed-use" memory array. Since every single memory cell in the array can act either as a one-time programmable memory cell or as a rewritable memory cell, in this embodiment, a first set of memory cells operates as one-time programmable memory cells and a second, different set of memory cells operates as rewritable memory cells. In this way, one-time programmable memory cells and rewritable memory cells can be provided on the same integrated circuit. As above, testing can be performed to determine whether a given set of memory cells should be designated as one-time programmable memory cells or rewritable memory cells.

Figure 17:
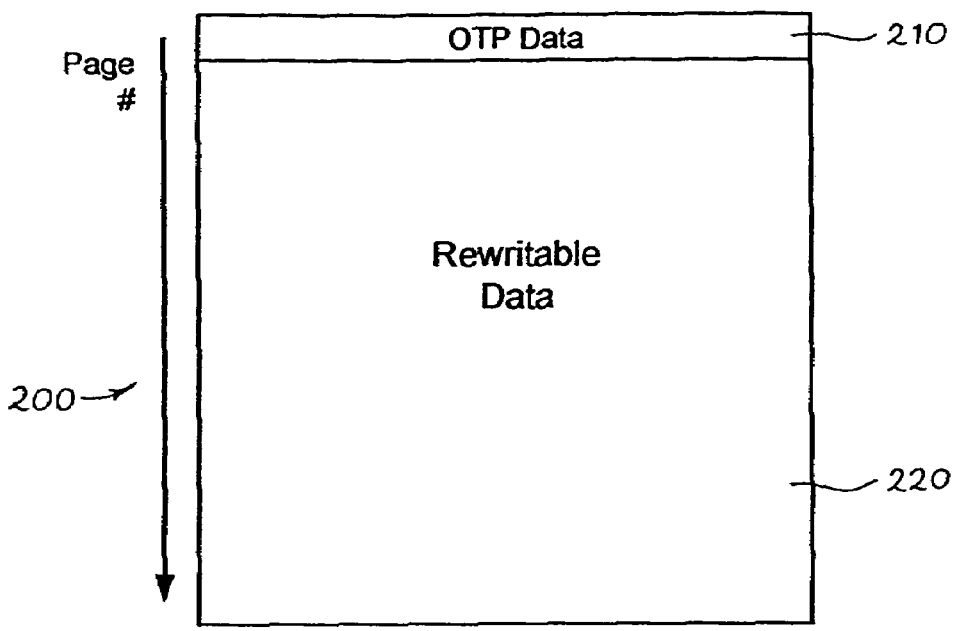
FIG. 17 is an illustration of a mixed-use memory array of a preferred embodiment in which a first set of memory cells operate as one-time programmable memory cells and a second set of memory cells operate as rewritable memory cells.

FIG. 17 is an illustration of a mixed use array 200 of a preferred embodiment. A first set of memory cells 210 operates as one-time programmable memory cells and a second, different set of memory cells 220 operates as rewritable memory cells. In this embodiment, the memory cells in both sets 210, 220 contain the same number of data states per cell, although variations in the number of data states per memory cell are possible, as described below. In one embodiment, the first set of memory cells stores data that is considered permanent and can relate to the operation of the memory array. Examples of such information includes, but is not limited to, one or more of the following: content management bits, trim bits, manufacturer data, and format data.

"Content management bits" refers to information that relates to the management of programmed content. "Trim bits" are customized information that set various options in on-chip circuitry. In operation, the on-chip circuitry reads the trim bits in the first set of memory cells 210, and the read trim bits control the further operation of the circuitry. For example, the trim bits could contain a setting for the preferred write/read value (current or voltage) of the write/read circuitry of the memory device. "Manufacturer data" can include the manufacturer's name and serial number. "Format data" indicates bad portions of the memory array; specifically, that a particular row and/or column in the memory array is bad and the location of a redundant row and/or column. Further information regarding redundancy can be found in U.S. patent application Ser. Nos. 10/402,385 and 10/024,646, which are assigned to the assignee of the present invention and are hereby incorporated by reference. Of course, these are merely examples, and other forms of information can be stored in the one-time programmable memory cells 210. For example, the first set of memory cells 210 can contain game content data (i.e., computer program code for a game), and the second set of memory cells 220 can contain game state data (i.e., an indication of the user's location in the game when the user requests that the game be saved). Also, the data in either the first or second sets 210, 220 can be programmed at the factory or by a subsequent user.

Figure 18:
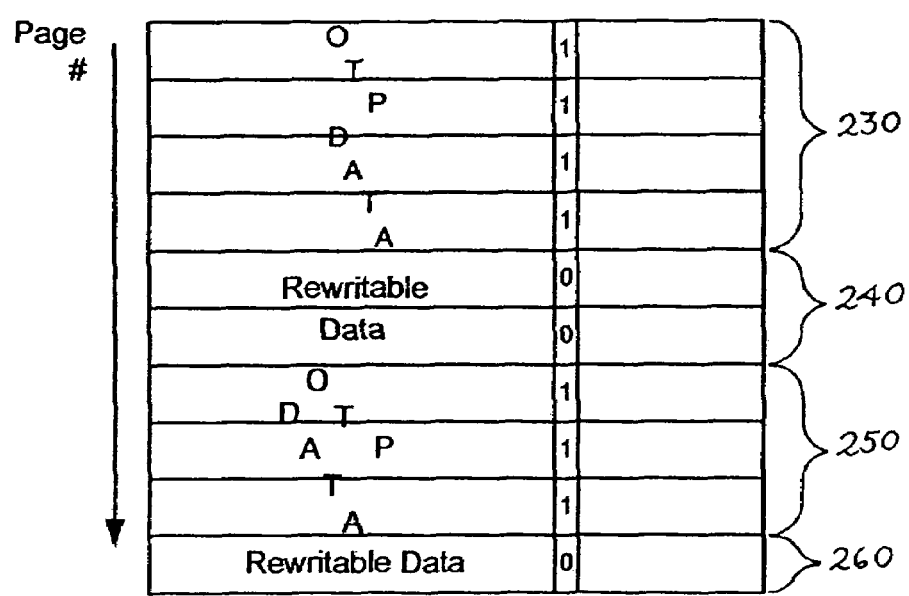
FIG. 18 is an illustration of a mixed-use memory array of a preferred embodiment in which multiple sets of one-time programmable and rewritable memory cells are interleaved.

In FIG. 17, there is only one section of one-time programmable memory cells and only one section of rewritable memory cells. In another embodiment, there is at least one additional set of memory cells operating as one-time programmable memory cells or rewritable memory cells. FIG. 18 shows such an embodiment, with two one-time programmable sections 230, 250 interleaved with two rewritable sections 240, 260 (i.e., two adjacent sets of memory cells are not both one-time programmable or both rewritable). As above, any data can be stored in any of the sections. For example, game content data can be stored in the one-time programmable sections 230, 250, and game state data can be stored in the rewritable sections 240, 260.

It should be noted that while FIGS. 17 and 18 show the sets of memory cells being horizontally oriented, in an alternate embodiment, one or more sets of memory cells can be vertically oriented. For example, instead of having format data being in a horizontal row of memory cells, as shown in FIG. 17, the format data can be in a vertical column of memory cells. In this way, the redundancy data would go across many pages. A mixed use of horizontally-oriented and vertically-oriented information can also be used. For example, the manufacturing data can be horizontally oriented, while the format data can be vertically oriented.

As shown in FIG. 18, each page of data can include one or more flag bits 270 that indicate whether a page is one-time programmable or rewritable. In FIG. 18, a "1" flag indicates one-time programmable, and a "0" flag indicates rewritable.

Preferably, the flag is stored in a one-time programmable memory cell (even if the memory cell is in a rewritable section). Also, preferably, the default read conditions are optimized for one-time programmable data (so the one-time programmable flag bit and the trim bits, manufacturing data, etc. stored in the one-time programmable section(s) can be successfully read), and the read conditions are modified if the flag indicates rewritable data. One advantage of using flag bits is that it is virtually impossible for a one-time programmable memory cell to be used as a rewritable memory cell, and vice versa, because the flag is interpreted by on-chip write circuitry, which is programmed to prevent writing to a memory cell more than one time if the flag bit indicates that the memory cell is one-time programmable.

As an alternative to using flag bits, the calculation of address space and write control can be moved off-chip, for example, to hardware/software in a host device. For example, if the memory device is used as a game cartridge, software in the host device can use a pre-designated address space (known to the host device but not the memory) for storing game state data. Alternatively, the host device can be informed of the address space for game state data by information stored in the game content data in the memory array, in another one-time programmable portion of the memory array (e.g., a special address location in the memory array (e.g., address 0000)), or in a device controller, separate from the memory array, in the memory device.

In the embodiments shown in FIGS. 17 and 18, the memory arrays were "mixed use" in the sense that some of the memory cells were one-time programmable and others were rewritable. In other embodiments, a "mixed use" memory array contains other "mixed" features instead of or in addition to the one-time programmable/rewritable feature. As before, a flag bit or other mechanism can be used to determine the nature of a given set of memory cells. For example, a first set of memory cells can be more reliable and have a wider temperature and voltage range than a second set of memory cells in the same memory array.

Figure 19:
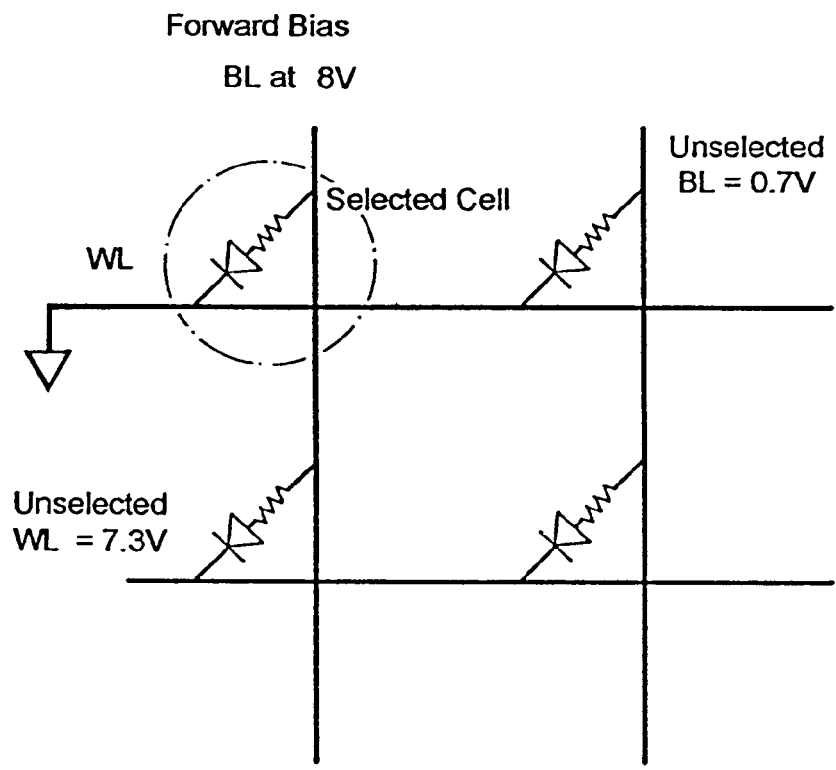
FIG. 19 is an illustration of a circuit of a preferred embodiment showing a set of memory cells that are programmed with forward bias.
Figure 20:
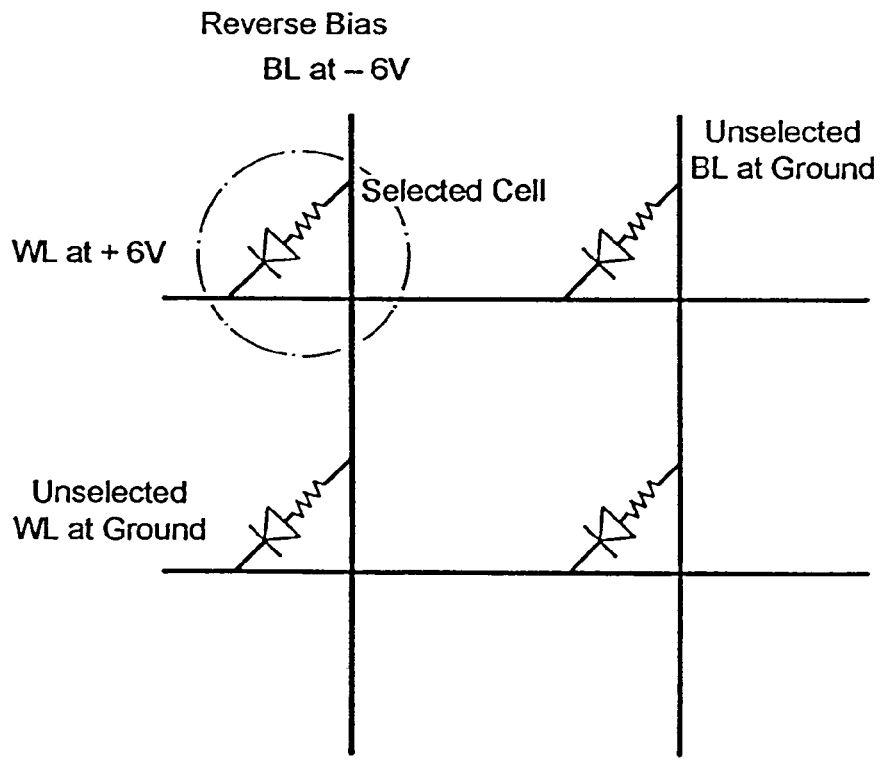
FIG. 20 is an illustration of a circuit of a preferred embodiment showing a set of memory cells that are programmed with reverse bias.

As another example, with the preferred memory cell structure described above, a given memory cell can either be (i) programmed with forward bias (e.g., as with a one-time programmable or rewritable memory cell) or (ii) programmed with reverse bias (e.g., as with a rewritable memory cell but not with a two-state one-time programmable memory cell). Stated another way, a one-time programmable memory cell can receive forward biasing programming only, while a rewritable memory cell can receive both forward and reverse biasing programming. This is shown in the circuit diagrams of FIGS. 19 and 20. Forward bias writing is described in more detail in U.S. Pat. No. 6,618,295, and reverse bias writing is described in more detail in U.S. patent application Ser. No. 11/461,339, entitled "Passive Element Memory Array Incorporating Reversible Polarity Word Line and Bit Line Decoders" and U.S. patent application Ser. No. 11/461,364, entitled "Method for Using a Passive Element Memory Array Incorporating Reversible Polarity Word Line and Bit Line Decoders," each of which is assigned to the assignee of the present invention and is hereby incorporated by reference. Accordingly, a "mixed use" memory array can contain a first set of memory cells that are programmed with forward bias and a second set of memory cells that are programmed with reverse bias. The memory cells that are programmed with reverse bias can also be erased with forward bias. In an erase operation (as compared to a write operation), individual data bits in a page are not variable, as all bits are erased in the operation. Erase operations are described in more detail in U.S. patent application Ser. No. 11/461,339, entitled "Passive Element Memory Array Incorporating Reversible Polarity Word Line and Bit Line Decoders" and U.S. patent application Ser. No. 11/461,364, entitled "Method for Using a Passive Element Memory Array Incorporating Reversible Polarity Word Line and Bit Line Decoders," each of which is assigned to the assignee of the present invention and is hereby incorporated by reference.

The discussion so far has related to the use of a memory cell as either one-time programmable or rewritable and memory arrays having a mixture of one-time programmable and rewritable memory cells. However, as noted above, another multi-use aspect of the preferred memory cell is that the memory cell (whether one-time programmable or rewritable) can store two data states or more than two data states. Multiple test memory cells can be tested for each possible data state to determine how many data states can be stored in a memory array. For example, test memory cells can be tested at the V, P, S, and R data states to project whether the memory cell operates acceptably as a four-state one-time programmable memory array. If the test fails, the memory array can be used as a two-state memory array, with the appropriate flag being stored in the memory array.

A mixed-use array can be used with one set of memory cells using X number of resistivity states to represent X data states, and a second set of memory cells using Y number of resistivity states to represent Y data states, where X≠Y. In this way, the number of data states stored in a memory cell can vary between sets of memory cells in the memory array. The various multi-uses and mixed uses described above can be combined. For example, first and second sets of memory cells in a memory array can use different numbers of data states and be both one-time programmable, be both rewritable, or be a mixture of one-time programmable and rewritable. In other words, multiple portions of a memory array can be any combination of one-time programmable memory cells and rewritable memory cells, with one portion storing X data states (e.g., two data states) and another portion storing Y data states (e.g., more than two data states). For example, a memory array can have a first set of memory cells that are one-time programmable and have more than two data states (e.g., for program data) and a second set of memory cells that are rewritable and have more than two data states (e.g., for use as a scratch pad memory). There can be more than two portions.

The choice of how many data states to use in any set of memory cells can be determined by testing, as described above. For example, if testing for a four-state one-time programmable memory cell fails because the read circuitry could not distinguish between the V, P, and R states, the portion of the memory array containing those test cells can be used as a two-state rewritable portion. In that situation, the write circuitry can use an iterative write program, as described above, to verify and then re-program again to "push" the R state toward the V state and "push" the S state toward the P state. In other words, the iterative feedback mechanism "opens the space" between the R state and the S state.

Figure 21:
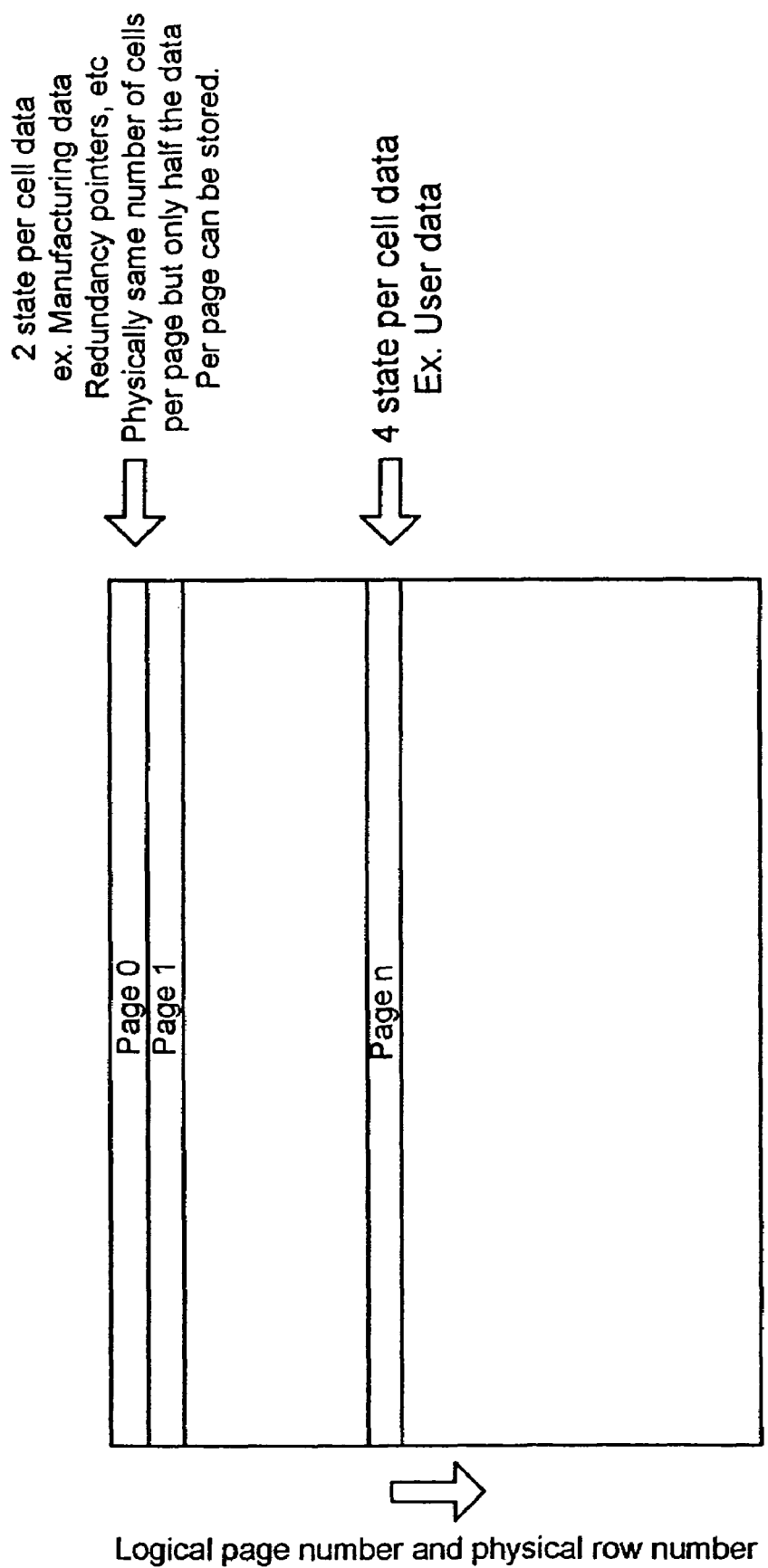
FIG. 21 is an illustration of a memory array of a preferred embodiment in which a first portion of the memory array stores two data states per memory cell and a second portion of the memory array stores four data states per memory cell.

A mixed-use array of different data states recognizes the fact that, although each memory cell has the potential of storing more than two data states, the most efficient use of memory cells in a memory array may occur when not all the memory cells in the memory array store more than two states. For example, in one preferred embodiment, a first set of memory cells are used as two-state one-time programmable memory cells, and a second set of memory cells are used as four-state one-time programmable memory cells. This embodiment is illustrated in FIG. 21. In this embodiment, optimum circuit configuration settings for reading the four-state memory cells are stored in the two-state memory cells.

For example, as shown in FIG. 21, configuration bits in page 0 indicate which pages are to be read with a two-state-per-cell read circuitry operation versus a four-state-per-cell read circuitry operation. The configuration bits also determine the limitation in useable bits in the two-state-per-cell pages. When page 0 is written, the portion of the chip for the two-state data and the four-state data is configured. For one-time programmable memory cell usage, page 0 can be written several times adding additional configuration bits indicating additional portions for two-state data because configuration bits all set to logic one indicate that all but page zero are to be read as four-state data (i.e., the default configuration is to only read page 0 as two-state data). The virgin one-time programmable memory cell state (the V state) is logical one. The default configuration and the interpretation of configuration bits is done by logic coding on the memory chip. Row numbers and page numbers are not necessarily equal, but a simple multiple (e.g., four pages to one row) is preferred.

Of course, other configurations are possible. For example, another application can have a third portion also as two-state per cell data based on manufacturing testing indicating less than optimum cells in the third portion of the memory array. In yet another application, the memory array has two-state one-time programmable memory cells in a first portion and more than two-state rewritable memory cells (e.g., using the R, S, and R1 states). The optimum circuit configurations are preferably stored in two-state one-time programmable memory cells. Further, the memory array can have two-state rewritable memory cells in a first portion and more than two-state rewritable memory cells in a second portion.

Figure 22:
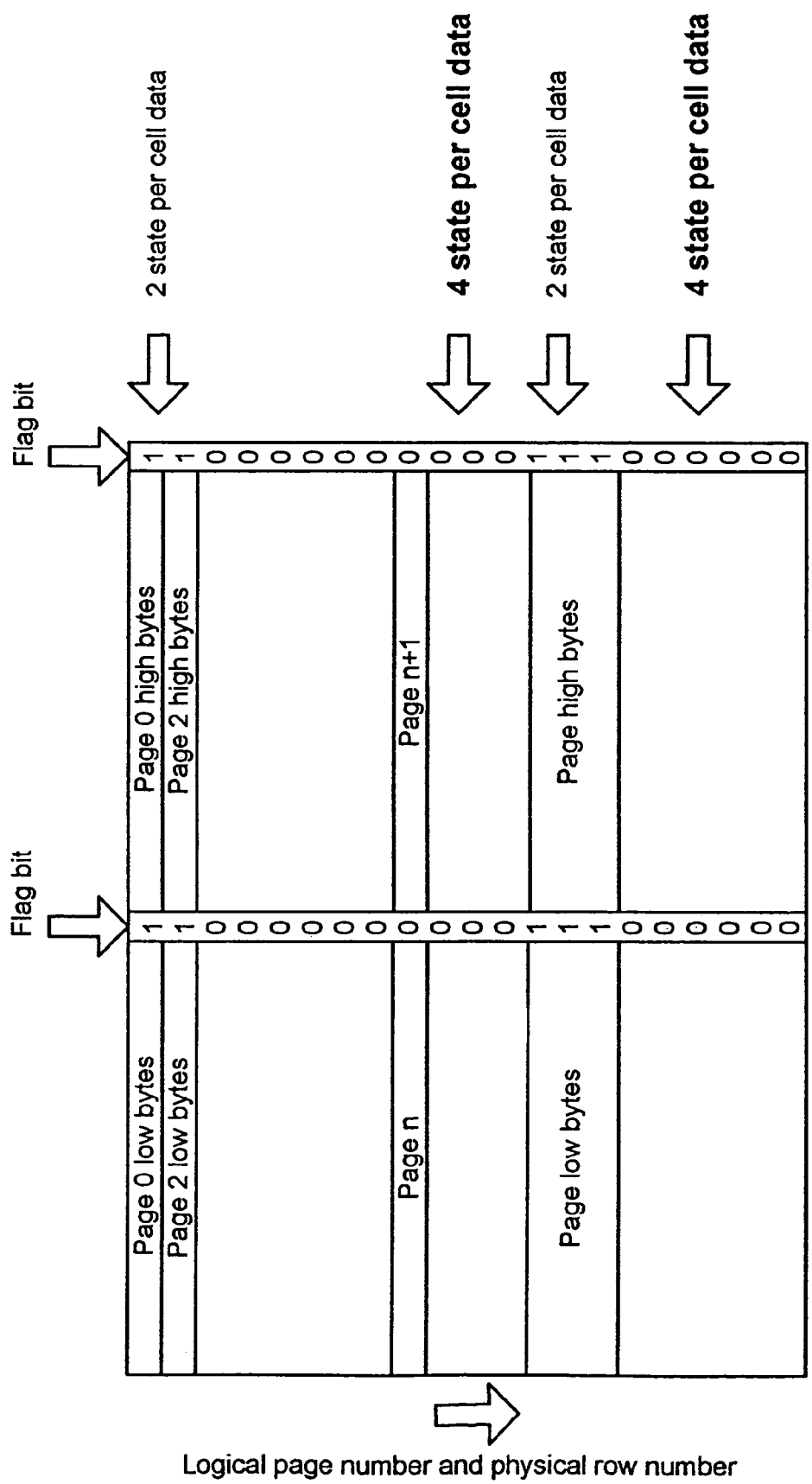
FIG. 22 is an illustration of a memory array of a preferred embodiment in which two-state-per-cell portions and four-state-per-cell portions are indicated by flag bits on each physical page.

Turning again to the drawings, FIG. 22 is an illustration of a memory array of a preferred embodiment in which two-state-per-cell portions and four-state-per-cell portions are indicated by flag bits on each physical page. The flag bit is preferably two-state-per-cell data. An even number of pages are associated with each row. A flag bit for odd pages read as one indicate the page is not available. Unavailable pages are also stored off the memory chip in control logic or software and can be reassigned by known redundancy/bad block mechanisms. Optionally, shared flag bit or bits per row can be used, where the flag is associated with multiple pages and indicates the number of states per cell for the row and the unavailability of some pages. It is preferred that an even number of pages per row be used. The block for bad block table use is preferably defined as half the row for a number of adjacent rows.

Figure 23:
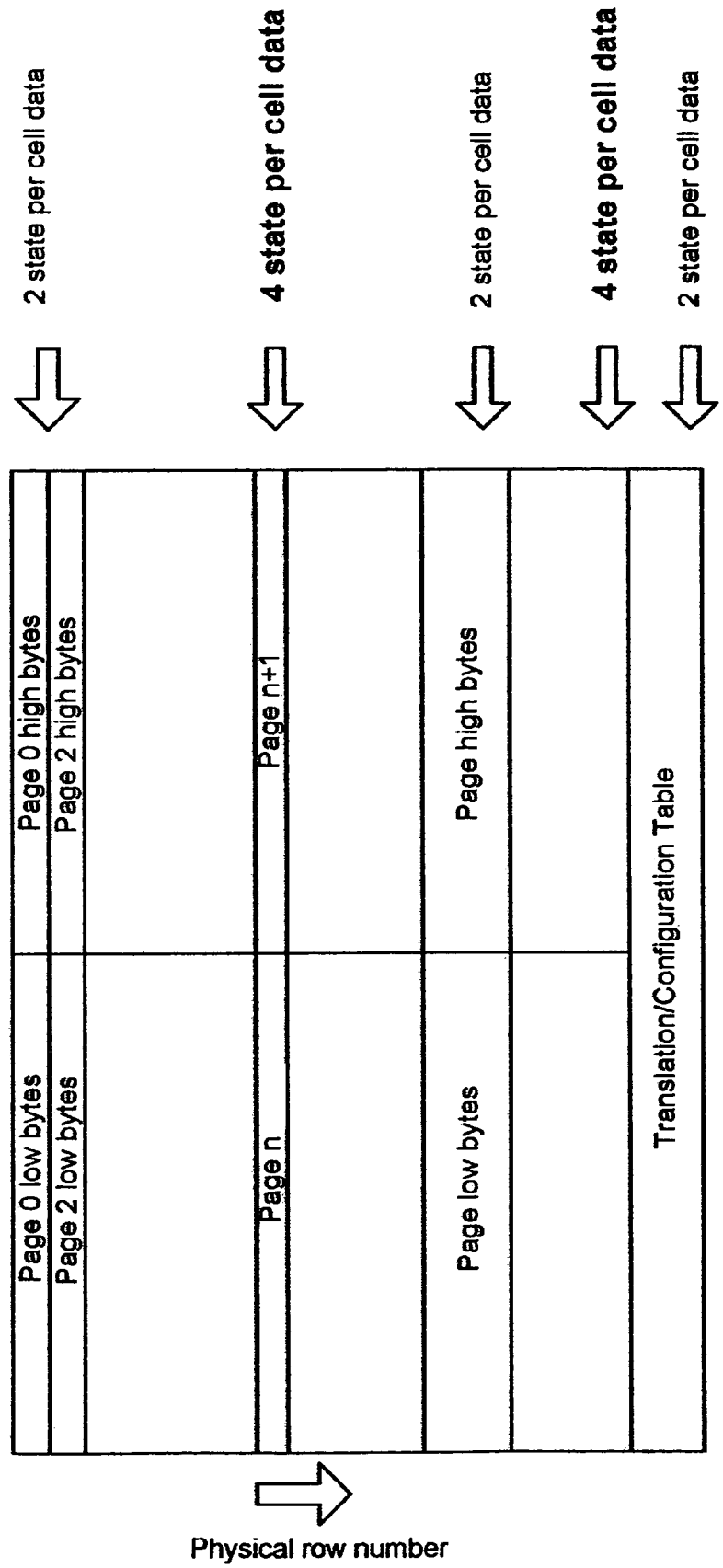
FIG. 23 is an illustration of a memory array of a preferred embodiment in which two-state-per-cell portions and four-state-per-cell portions are indicated by a translation table stored in the memory array.

FIG. 23 is an illustration of a memory array of a preferred embodiment in which two-state-per-cell portions and four-state-per-cell portions are indicated by a translation table stored in the memory array. The table has a correspondence between the logical page address and physical rows in the memory array. The table also contains the flag bit for the number of bits stored at a physical row. Optionally, the table could also have a flag that indicates certain pages are one-time programmable or rewritable data. The flag bits preferably control read and write circuitry to the optimum setting for the indicated data type.

Figure 24:
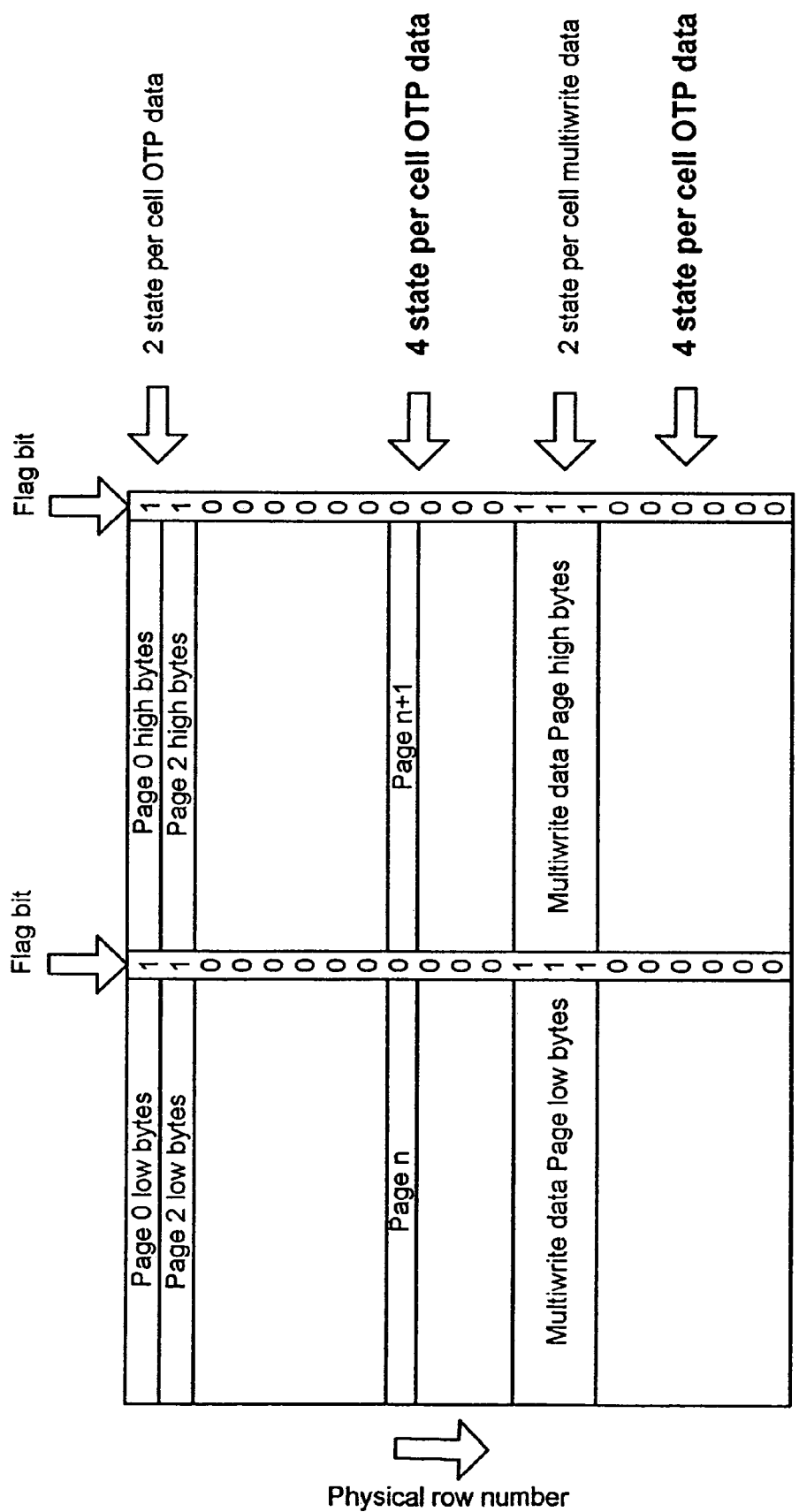
FIG. 24 is an illustration of a memory array of a preferred embodiment in which a two-state-per-cell one-time programmable portion, a two-state-per-cell rewritable portion, and a four-state-per-cell one-time programmable portion are indicated by flag bits on each physical page.

FIG. 24 is an illustration of a memory array of a preferred embodiment in which a two-state-per-cell one-time programmable portion, a two-state-per-cell rewritable portion, and a four-state-per-cell one-time programmable portion are indicated by flag bits on each physical page. In this embodiment, the flag bits are stored as two-state per cell data. An even number of pages are associated with each row. An off-chip controller scans the flag information to create a bad block table. Flag bits for some pages indicate the page is not available. Flag bits also preferably control on-chip read and write circuitry to provide an optimum configuration for more than two-state-per-cell operations and rewritable versus one-time programmable operations. In this case, the flag bits indicated in FIG. 24 contain at least one bit to indicate the number of states per cell and one bit to indicate one-time programmable or rewritable. More than two bits can be used in some embodiments.

Figure 25:
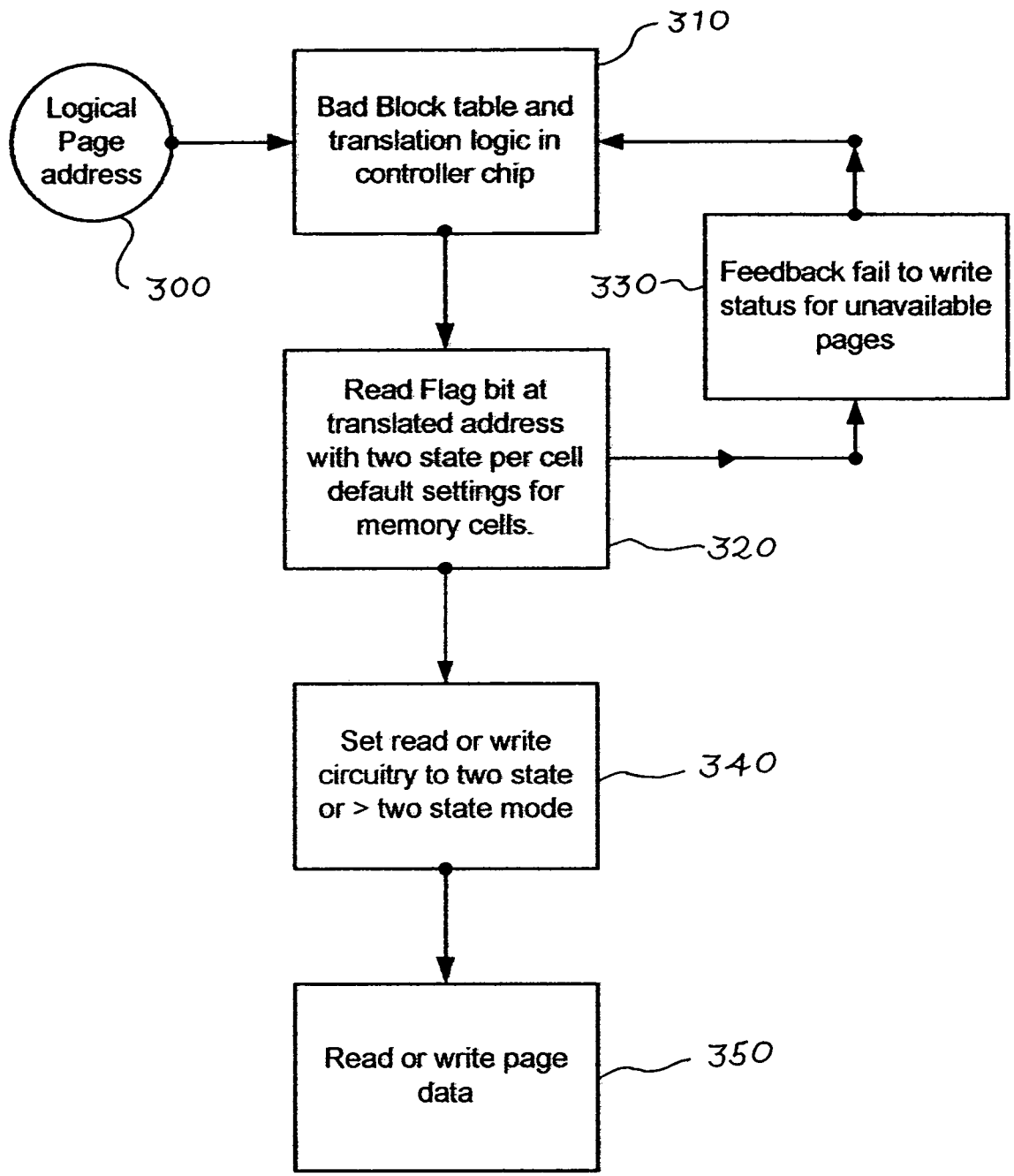
FIG. 25 is a flow chart of a preferred embodiment for using chip flags and an off-chip bad block mechanism.

FIG. 25 is a flow chart of a preferred embodiment for using chip flags and an off-chip bad block mechanism. A logical page address is provided (step 300). A bad block table and translation logic in the controller chip of the memory device determines a preliminary physical address associated with the logical page address (step 310). Then, the flag bit at the preliminary physical address is read with the two-state-per-cell default setting (step 320). If the page is unavailable, a feedback mechanism is used to update the write status for unavailable pages (step 330), which causes the controller chip to update the bad block table. Otherwise, the read or write circuitry is set to a two-state mode or a more-than-two-state mode (act 340). Then, page data is read or written (act 350).

While any suitable memory cell can be used with these embodiment, it is presently preferred that the memory cell comprises a passive memory element comprising a switchable resistance material, preferably a semiconductor material; specifically, a polysilicon diode. Other switchable resistance materials include, but are not limited to, binary metal oxides, phase change materials as shown in U.S. Pat. No. 5,751,012 and U.S. Pat. No. 4,646,266, and organic material resistors, for example a memory cell comprising layers of organic materials including at least one layer that has a diode-like characteristic conduction and at least one organic material that changes conductivity with the application of an electric field. U.S. Pat. No. 6,055,180 describes organic passive element arrays. Another variable resistance material is amorphous silicon doped with V, Co, Ni, Pd, Fe or Mn, for example as described more fully in U.S. Pat. No. 5,541,869. Another class of material is taught by U.S. Pat. No. 6,473,332. These are perovskite materials such as $Pr_{1-X}Ca_XMnO_3$ (PCMO), $La_{1-X}Ca_XMnO_3$ (LCMO), $LaSrMnO_3$ (LSMO), or $GdBa-Co_XO_Y$ (GBCO). Another option for this variable-resistance material is a carbon-polymer film comprising carbon black particulates or graphite, for example, mixed into a plastic polymer, as taught in U.S. Pat. No. 6,072,716. Another switchable resistance material is taught in U.S. patent application Ser. No. 09/943,190 and in U.S. patent application Ser. No. 09/941,544. This material is doped chalcogenide glass of the formula $A_XB_Y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is preferably formed in a memory cell adjacent to a reservoir of mobile metal ions. Some other solid electrolyte material could substitute for chalcogenide glass.

In one preferred embodiment, the element comprises an antifuse in series with the semiconductor material. In another preferred embodiment, the memory element comprises an antifuse, a binary metal oxide, and a polysilicon diode isolation device. Further, while the memory cells can be part of a two-dimensional array, it is preferred that the memory cells be part of a monolithic three-dimensional memory array, with the memory cells arranged in a plurality of memory levels, each formed above a single substrate with no intervening substrates.

It is presently preferred that the memory element be nonvolatile. However, in an alternate embodiment, the memory element can be volatile in the data states used when the memory cell operates as a rewritable memory cell. For example, a memory element may allow the V state and the P state to be permanent but may allow the R and S states to slowly fade away. With such a memory element, the R state and S state data would be refreshed over time.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for using a memory array, the method comprising:
   (a) providing a memory array comprising a plurality of memory cells, each memory cell comprising a memory element comprising a semiconductor material configurable to one of at least three resistivity states, wherein a first resistivity state is used to represent a data state of the memory cell when the memory cell operates as a one-time programmable memory cell but not when the memory cell operates as a rewritable memory cell; and
   (b) performing at least one of the following:
      (b1) using at least some of the memory cells as one-time programmable memory cells, wherein a one-time programmable memory cell uses the first resistivity state to represent a data state of the memory cell; or
      (b2) using at least some of the memory cells as rewritable memory cells, wherein a rewritable memory cell does not use the first resistivity state to represent a data state of the memory cell.

2. The method of claim 1 further comprising:
   before (b), predicting whether memory cells in the memory array will program correctly as rewritable memory cells by testing a set of test memory cells in the memory array;
   wherein if the memory cells in the memory array are predicted to program correctly as rewritable memory cells, (b) comprises performing (b2); and
   wherein if the memory cells in the memory array are not predicted to program correctly as rewritable memory cells, (b) comprises performing (b1).

3. The method of claim 1 further comprising:
   before (b), predicting whether memory cells in the memory array will program correctly as at least three-state one-time programmable memory cells by testing a set of test memory cells in the memory array;
   wherein if the memory cells in the memory array are predicted to program correctly as at least three-state one-time programmable memory cells, (b) comprises performing (b1), and wherein (b1) comprises using at least some of the memory cells as at least three-state one-time programmable memory cells; and
   wherein if the memory cells in the memory array are not predicted to program correctly as at least three-state one-time programmable memory cells, (b) comprises performing (b2).

4. The method of claim 1, wherein each memory cell comprising a memory element comprising a semiconductor material configurable to one of at least four resistivity states, and wherein the method further comprises:
   before (b), predicting whether memory cells in the memory array will program correctly as four-state one-time programmable memory cells by testing a set of test memory cells in the memory array;
   wherein, if the memory cells in the memory array are predicted to program correctly as four-state one-time programmable memory cells, (b1) comprises using at least some of the memory cells as four-state one-time programmable memory cells; and
   wherein, if the memory cells in the memory array are not predicted to program correctly as four-state one-time programmable memory cells, (b1) comprises using at least some of the memory cells as two-state one-time programmable memory cells.

5. The method of claim 1, wherein (b1) comprising using all of the memory cells as one-time programmable memory cells.

6. The method of claim 1, wherein (b2) comprising using all of the memory cells as rewritable memory cells.

7. The method of claim 1, wherein (b) comprises performing both (b1) and (b2).

8. The method of claim 1 further comprising storing a flag in the memory array indicating whether the memory array is a one-time programmable memory array or a rewritable memory array.

9. The method of claim 1, wherein when a memory cell operates as a one-time programmable memory cell, the memory cell only receives forward bias programming, and wherein when a memory cell operates as a rewritable memory cell, the memory cell receives both forward bias and reverse bias programming.

* * * * *